(12) United States Patent  
Murzyn et al.

(10) Patent No.: US 12,321,073 B2
(45) Date of Patent: Jun. 3, 2025

(54) ACTIVE PUBLIC/PRIVACY DISPLAY PANELS

(71) Applicant: VISTEON GLOBAL TECHNOLOGIES, INC., Van Buren Township, MI (US)

(72) Inventors: Pawel Murzyn, Chelmsford (GB); Danail Krasimirov Totev, Sofia (BG); Paul Fredrick Luther Weindorf, Novi, MI (US)

(73) Assignee: Visteon Global Technologies, Inc., Van Buren Township, MI (US)

( * ) Notice: Subject to any disclaimer, the term of this patent is extended or adjusted under 35 U.S.C. 154(b) by 0 days.

(21) Appl. No.: 18/337,290

(22) Filed: Jun. 19, 2023

(65) Prior Publication Data

US 2023/0408881 A1 Dec. 21, 2023

Related U.S. Application Data

(60) Provisional application No. 63/353,945, filed on Jun. 21, 2022.

(51) Int. Cl.
*G02F 1/139* (2006.01)
*B60K 35/00* (2024.01)
*B60K 35/22* (2024.01)
*G02F 1/13* (2006.01)
*G02F 1/1335* (2006.01)
*H10K 59/50* (2023.01)

(52) U.S. Cl.
CPC .......... *G02F 1/1398* (2021.01); *G02F 1/1323* (2013.01); *G02F 1/133528* (2013.01); *B60K 35/00* (2013.01); *B60K 35/22* (2024.01); *B60K 2360/1526* (2024.01); *H10K 59/50* (2023.02)

(58) Field of Classification Search
CPC .............. G02F 1/1323; G09G 2358/00; G09G 2320/068; H04N 2013/403
See application file for complete search history.

(56) References Cited

U.S. PATENT DOCUMENTS

2005/0243265 A1* 11/2005 Winlow ................ G02F 1/1323
349/178
2012/0013825 A1 1/2012 Sugiura et al.
(Continued)

FOREIGN PATENT DOCUMENTS

CN 110618547 A † 12/2019
CN 111458911 A † 7/2020

*Primary Examiner* — Jonathan Y Jung
(74) *Attorney, Agent, or Firm* — Quinn IP Law

(57) ABSTRACT

A display panel includes a first polarizer, two twisted nematic cells, a second polarizer, and a display. The first twisted nematic cell transfers light in response to a first control signal. In an off state, a polarity of the light is rotated in a first twist. In an on state, the polarity of the light is maintained. The second twisted nematic cell transfers the light in response to a second control signal. In the off state, a polarity of the light is rotated in a second twist. In the on state, the polarity of the light is maintained. The display generates an image in the light in response to a display signal. While the twisted nematic cells are in the off state, the image is viewable in a public viewing angle. While the twisted nematic cells are in the on state, the image is viewable in a private viewing angle.

20 Claims, 14 Drawing Sheets

(56) References Cited

U.S. PATENT DOCUMENTS

| | | | |
|---|---|---|---|
| 2014/0184968 A1† | 7/2014 | Niikura | |
| 2014/0327837 A1* | 11/2014 | Osterman | G02F 1/1396 349/2 |
| 2014/0333874 A1† | 11/2014 | Sato | |
| 2015/0177563 A1† | 6/2015 | Cho | |
| 2016/0011429 A1* | 1/2016 | Vdovin | G02B 30/31 359/462 |
| 2019/0293974 A1† | 9/2019 | Chen | |
| 2019/0353943 A1 | 11/2019 | Smith et al. | |
| 2019/0353944 A1* | 11/2019 | Acreman | G02F 1/137 |
| 2021/0195714 A1† | 6/2021 | Woodgate | |
| 2021/0333577 A1 | 10/2021 | Robinson et al. | |
| 2021/0333580 A1† | 10/2021 | Matsushima | |
| 2021/0333626 A1* | 10/2021 | Luo | G02F 1/133638 |
| 2021/0405458 A1* | 12/2021 | Zhong | G02F 1/133531 |

\* cited by examiner
† cited by third party

ACTIVE PUBLIC/PRIVACY DISPLAY PANELS

CROSS-REFERENCE TO RELATED APPLICATIONS

This application claims the benefit of U.S. Provisional Application No. 63/353,945, filed Jun. 21, 2022, which is hereby incorporated by reference in its entirety.

TECHNICAL FIELD

The present disclosure generally relates to visibility of electronic displays, and in particular to display panels with an active public mode and a privacy mode.

BACKGROUND

Console-based display panels are becoming more popular in automobiles. The display panels are commonly intended for use by a driver of the automobile and a passenger sitting next to the driver. With an availability of video sources and Internet content within the automobiles, conflicts have been created between the drivers and the passengers for what content to present on the display panels.

SUMMARY

A display panel is provided herein. The display panel includes a first polarizer, a first twisted nematic cell, a second twisted nematic cell, a second polarizer, and a display. The first polarizer is configured to transfer a light to have a polarity. The first twisted nematic cell is mounted adjacent to the first polarizer. The first twisted nematic cell transfers the light received from the first polarizer in response to a first control signal. The first control signal is switchable between a first off state and a first on state. The first off state rotates the polarity of the light in a first twist. The first on state maintains the polarity of the light in an angular range. The second twisted nematic cell is mounted adjacent to the first twisted nematic cell. The second twisted nematic cell transfers the light received from the first twisted nematic cell in response to a second control signal. The second control signal is switchable between a second off state and a second on state. The second off state rotates the polarity in a second twist. The second on state maintains the polarity of the light in the angular range. The second twist is in an opposite direction as the first twist.

The second polarizer is mounted adjacent to the second twisted nematic cell and configured to polarize the light received from the second twisted nematic cell. The display is mounted adjacent to one of the first polarizer or the second polarizer and configured to generate an image in the light in response to a display signal. While the first twisted nematic cell is in the first off state and the second twisted nematic cell is in the second off state, the image is viewable in a public viewing angle. While the first twisted nematic cell is in the first on state and the second twisted nematic cell is in the second on state, the image is viewable in a private viewing angle. The private viewing angle is narrower than the public viewing angle.

In one or more embodiments of the display panel, the display is a thin-film transistor display mounted adjacent to the second polarizer.

In one or more embodiments, the display panel includes a backlight source mounted adjacent to the first polarizer.

In one or more embodiments, the display panel includes a dual brightness enhancement film mounted between the backlight source and the first polarizer.

In one or more embodiments of the display panel, the display is an organic light-emitting diode display mounted adjacent to the first polarizer, and the first polarizer is oriented in response to a polarization input for the first twisted nematic cell.

In one or more embodiments, the display panel includes a quarter-wave plate mounted adjacent to the display and oriented to one of 135 degrees or 45 degrees.

In one or more embodiments, the display panel includes a third polarizer mounted between the first twisted nematic cell and the second twisted nematic cell.

In one or more embodiments, the display panel includes a compensated half-wave plate mounted between the second twisted nematic cell and the second polarizer.

In one or more embodiments, the display panel includes a first compensation stack mounted between the first twisted nematic cell and the second twisted nematic cell.

In one or more embodiments, the display panel includes a second compensation stack mounted between the second twisted nematic cell and the second polarizer.

A display panel is provided herein. The display panel includes a first polarizer, a first twisted nematic cell, a second twisted nematic cell, and a display. The first polarizer is configured to transfer a light to have a polarity. The first twisted nematic cell is mounted adjacent to the first polarizer. The first twisted nematic cell has a first cell gap that results in a first color shift. The first twisted nematic cell transfers the light received from the first polarizer in response to a first control signal. The first control signal is switchable between a first off state and a first on state. The second twisted nematic cell is mounted adjacent to the first twisted nematic cell. The second twisted nematic cell has a second cell gap that results in a second color shift. The second color shift compensates for the first color shift. The second twisted nematic cell transfers the light received from the first twisted nematic cell in response to a second control signal. The second control signal is switchable between a second off state and a second on state.

The second polarizer is mounted adjacent to the second twisted nematic cell and configured to polarize the light received from the second twisted nematic cell. The display is mounted adjacent to one of the first polarizer or the second polarizer and configured to generate an image in the light in response to a display signal. While the first twisted nematic cell is in the first off state and the second twisted nematic cell is in the second off state, the image is viewable in a public viewing angle. While the first twisted nematic cell is in the first on state and the second twisted nematic cell is in the second on state, the image is viewable in a private viewing angle. The private viewing angle is narrower than the public viewing angle.

In one or more embodiments of the display panel, the display is a thin-film transistor display mounted adjacent to the second polarizer.

In one or more embodiments, the display panel further includes a backlight source mounted adjacent to the first polarizer.

In one or more embodiments, the display panel further includes comprising a third polarizer mounted between the first twisted nematic cell and the second twisted nematic cell.

In one or more embodiments, the display panel further includes a compensated half-wave plate mounted between the second twisted nematic cell and the second polarizer.

A display panel is provided herein. The display panel includes a first polarizer, a first twisted nematic cell, a second polarizer, and a display. The first polarizer is configured to transfer a light to have a polarity. The first twisted nematic cell is mounted adjacent to the first polarizer. The first twisted nematic cell transfers the light received from the first polarizer in response to a first control signal. The first control signal is switchable between a first off state and a first on state. The first off state rotates the polarity of the light in a first twist. The first on state maintains the polarity of the light in an angular range.

The second polarizer is mounted adjacent to the first twisted nematic cell and configured to polarize the light received from the first twisted nematic cell. The display is mounted adjacent to the second polarizer and configured to generate an image in the light in response to a display signal. While the first twisted nematic cell is in the first off state, the image is viewable in a public viewing angle. While the first twisted nematic cell is in the first on state, the image is viewable in a private viewing angle. The private viewing angle is narrower than the public viewing angle.

In one or more embodiments of the display panel, the display is a thin-film transistor display.

In one or more embodiments, the display panel further includes a backlight source mounted adjacent to the first polarizer.

In one or more embodiments, the display panel further includes a compensation stack mounted between the first twisted nematic cell and the second polarizer.

A display panel is provided herein. The display panel includes a first polarizer, a first twisted nematic cell, a second twisted nematic cell, a second polarizer, and a display. The first polarizer is configured to transfer a light to have a polarity. The first twisted nematic cell is mounted adjacent to the first polarizer. The first twisted nematic cell transfers the light received from the first polarizer in response to a first control signal. The first control signal is switchable between a first white state and a first black state. The first white state rotates the polarity of the light in an angular range. The first black state maintains the polarity of the light. The second twisted nematic cell is mounted adjacent to the first twisted nematic cell. The second twisted nematic cell transfers the light received from the first twisted nematic cell in response to a second control signal. The second control signal is switchable between an intermediate state and a second white state. The second white state does not rotate the polarity of the light. The intermediate state maintains the polarity of the light in the angular range.

The second polarizer is mounted adjacent to the second twisted nematic cell and is configured to polarize the light received from the second twisted nematic cell. The display is mounted adjacent to one of the first polarizer or the second polarizer and is configured to generate an image in the light in response to a display signal. The first twisted nematic cell and the second twisted nematic cell are controlled to present the image switchable between a public viewing angle and a private viewing angle. The private viewing angle is narrower than the public viewing angle.

An instrument panel is provided herein. The instrument panel includes a control unit, a first polarizer, a first twisted nematic cell, a second twisted nematic cell, a second polarizer, and a display. The control unit is configured to generate a first control signal, a second control signal, and a display signal. The first polarizer is configured to transfer a light to have a polarity. The first twisted nematic cell is mounted adjacent to the first polarizer. The first twisted nematic cell transfers the light received from the first polarizer in response to the first control signal. The first control signal is switchable between a first off state and a first on state. The first off state rotates the polarity of the light in a first twist. The first on state maintains the polarity of the light in an angular range. The second twisted nematic cell is mounted adjacent to the first twisted nematic cell. The second twisted nematic cell transfers the light received from the first twisted nematic cell in response to the second control signal. The second control signal is switchable between a second off state and a second on state. The second off state rotates the polarity in a second twist. The second on state maintains the polarity of the light in the angular range. The second twist is in an opposite direction as the first twist.

The second polarizer is mounted adjacent to the second twisted nematic cell and configured to polarize the light received from the second twisted nematic cell. The display is mounted adjacent to one of the first polarizer or the second polarizer and configured to generate an image in the light in response to the display signal. While the first twisted nematic cell is in the first off state and the second twisted nematic cell is in the second off state, the image is viewable in a public viewing angle. While the first twisted nematic cell is in the first on state and the second twisted nematic cell is in the second on state, the image is viewable in a private viewing angle. The private viewing angle is narrower than the public viewing angle.

In one or more embodiments of the instrument panel, the display is a thin-film transistor display mounted adjacent to the second polarizer.

In one or more embodiments, the instrument panel includes a backlight source mounted adjacent to the first polarizer.

In one or more embodiments, the instrument panel includes a dual brightness enhancement film mounted between the backlight source and the first polarizer.

In one or more embodiments of the instrument panel, the display is an organic light-emitting diode display mounted adjacent to the first polarizer, and the first polarizer is oriented in response to a polarization input for the first twisted nematic cell.

In one or more embodiments, the instrument panel includes a quarter-wave plate mounted adjacent to the display and oriented to one of 135 degrees or 45 degrees.

In one or more embodiments, the instrument panel includes a third polarizer mounted between the first twisted nematic cell and the second twisted nematic cell.

In one or more embodiments, the instrument panel includes a compensated half-wave plate mounted between the second twisted nematic cell and the second polarizer.

In one or more embodiments, the instrument panel includes a first compensation stack mounted between the first twisted nematic cell and the second twisted nematic cell, and a second compensation stack mounted between the second twisted nematic cell and the second polarizer.

A non-transitory computer readable medium on which is recorded instructions, executable by a processor, for control of a display panel is provided herein. Execution of the instructions causes the processor to generate a first control signal transferred to the display panel, generate a second control signal transferred to the display panel, and generate a display signal transferred to the display panel.

The display panel includes a first polarizer, a first twisted nematic cell, a second twisted nematic cell, a second polarizer, and a display. The first polarizer is configured to transfer a light to have a polarity. The first twisted nematic cell is mounted adjacent to the first polarizer. The first twisted nematic cell transfers the light received from the first polarizer in response to the first control signal. The first control signal is switchable between a first off state and a first on state. The first off state rotates the polarity of the light in a first twist. The first on state maintains the polarity of the light in an angular range. The second twisted nematic cell is mounted adjacent to the first twisted nematic cell. The second twisted nematic cell transfers the light received from the first twisted nematic cell in response to the second control signal. The second control signal is switchable between a second off state and a second on state. The second off state rotates the polarity in a second twist. The second on state maintains the polarity of the light in the angular range. The second twist is in an opposite direction as the first twist;

The second polarizer is mounted adjacent to the second twisted nematic cell and configured to polarize the light received from the second twisted nematic cell. The display is mounted adjacent to one of the first polarizer or the second polarizer and configured to generate an image in the light in response to the display signal. While the first twisted nematic cell is in the first off state and the second twisted nematic cell is in the second off state, the image is viewable in a public viewing angle. While the first twisted nematic cell is in the first on state and the second twisted nematic cell is in the second on state, the image is viewable in a private viewing angle. The private viewing angle is narrower than the public viewing angle.

The above features and advantages and other features and advantages of the present teachings are readily apparent from the following detailed description of the best modes for carrying out the teachings when taken in connection with the accompanying drawings.

Figure 1:
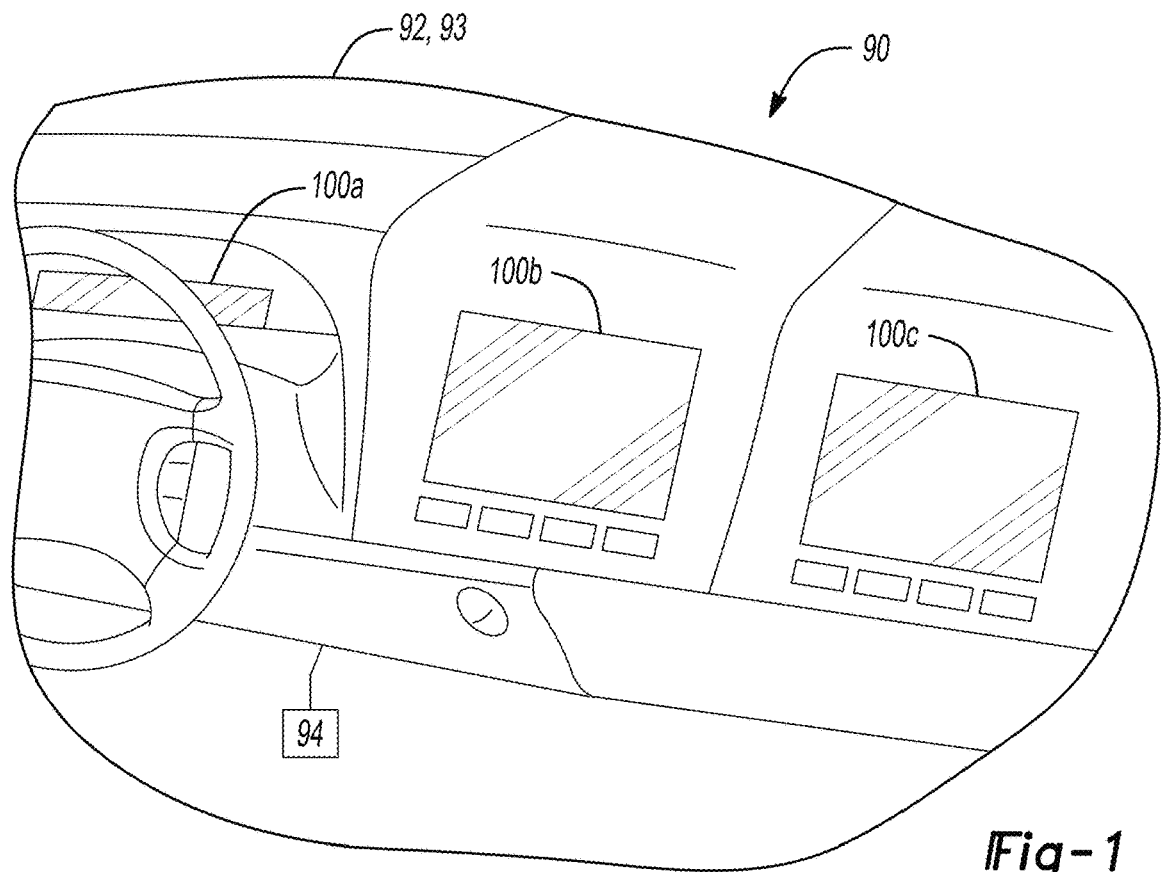
FIG. 1 illustrates a context of a platform in accordance with one or more exemplary embodiments.

The present disclosure may have various modifications and alternative forms, and some representative embodiments are shown by way of example in the drawings and will be described in detail herein. Novel aspects of this disclosure are not limited to the particular forms illustrated in the above-enumerated drawings. Rather, the disclosure is to cover modifications, equivalents, and combinations falling within the scope of the disclosure as encompassed by the appended claims.

DETAILED DESCRIPTION

Embodiments of the disclosure generally provide for a display panel configured to generate an optical signal conveying a plurality of images. The optical signal may be transitioned between a private viewing angle (or mode) of operation and a public viewing angle (or mode) of operation. In various embodiments, the transition may be a discrete step between the private viewing angle and the public viewing angle. In other embodiments, the transition may be continuous between the private viewing angle and the public viewing angle. While in the private viewing angle of operation, the optical signal may have a narrow viewing range limited to a few tens of degrees (e.g., ±25 degrees) from a normal line incident to a surface of the display panel. While in the public viewing angle of operation, the optical signal may have a wide viewing range (e.g., ±60 degrees) about the normal line incident to the surface of the display panel.

In various embodiments, the display panel implements a thin-film transistor (TFT) display with a separate backlight source (either edge or matrix backlighting) to create the light. In other embodiments, the display panel implements an organic light-emitting diode (OLED) display that generates and presents the light used to create the optical signal. A pair of electrically switchable twisted nematic cells with opposite liquid crystal (LC) twist directions are disposed in the path of the light. The opposite liquid crystal twist directions provide self-compensation for color shifting and allow a reduction in color variations in transmittance changes between zero degrees (e.g., normal to a plane of the display panel) and approximately 45 degrees viewing angles.

The liquid crystal cells (or retarder cells) act as a switchable angular luminance shutter. Compensation layers and stack optimization layers may be included to improve angular performance and efficiency. Further reductions in the color shift may be achieved by use of wide angle type of compensated half-wave plate that may include additional compensation layers and/or alternating wave plate layers.

FIG. 1 illustrates a context of a platform 90 in accordance with one or more exemplary embodiments. The platform 90 generally includes an instrument panel 92. The instrument panel 92 includes a control unit 94 and one or more display panels 100*a*-100*c*. The instrument panel 92 may be implemented as part of a vehicle 93. The vehicle 93 may include mobile vehicles such as automobiles, trucks, motorcycles, boats, trains and/or aircraft. In some embodiments, the instrument panel 92 may be part of a stationary object. The stationary objects may include, but are not limited to, billboards, kiosks, and/or marquees. Other types of platforms 90 may be implemented to meet the design criteria of a particular application.

The control unit 94 implements one or more display-drive circuits. The control unit 94 is generally operational to generate control signals that drive the display panels 100*a*-100*c*. In various embodiments, the control signals may be configured to provide instrumentation (e.g., speed, tachometer, fuel, temperature, etc.) to at least one display panel 100*a*-100*c* (e.g., 100*a*). In some embodiments, the control signals may also be configured to provide video (e.g., a rear-view camera video, a forward-view camera video, an onboard DVD player, etc.) to the display panels 100*a*-100*c*. In other embodiments, the control signals may be further configured to provide alphanumeric information shown on one or more of the display panels 100*a*-100*c*.

In various embodiments, the control unit 94 generally comprises at least one microcontroller. The at least one microcontroller may include one or more processors, each of which may be embodied as a separate processor, an application specific integrated circuit (ASIC), a field programmable gate array (FPGA), or a dedicated electronic control unit.

The at least one microcontroller may be any sort of electronic processor (implemented in hardware, software executing on hardware, or a combination of both). The at least one microcontroller may also include tangible, non-transitory memory, (e.g., read-only memory in the form of optical, magnetic, and/or flash memory). For example, the at least one microcontroller may include application-suitable amounts of random-access memory, read-only memory, flash memory and other types of electrically-erasable programmable read-only memory, as well as accompanying hardware in the form of a high-speed clock or timer, analog-to-digital and digital-to-analog circuitry, and input/output circuitry and devices, as well as appropriate signal conditioning and buffer circuitry.

Computer-readable and executable instructions embodying the present method may be recorded (or stored) in the memory and executed as set forth herein. The executable instructions may be a series of instructions employed to run applications on the at least one microcontroller (either in the foreground or background). The at least one microcontroller may receive commands and information, in the form of one or more input signals from various controls or components in the platform 90 and communicate instructions to the display panels 100*a*-100*c* through one or more control signals to control the displays panels 100*a*-100*c*.

The display panels 100*a*-100*c* are generally mounted to the instrument panel 92. In various embodiments, one or more of the display panels 100*a*-100*c* may be disposed inside the platform 90 (e.g., vehicle 93). In other embodiments, one or more of the display panels 100*a*-100*c* may be disposed exterior to the platform 90. One or more display panels 100*a*-100*c* may implement an active public/privacy viewing modes. One or more display panels 100*a*-100*c* may also implement the active privacy mode. As illustrated, the display panel 100*a* may be a cluster display positioned for use by a driver. The display panel 100*b* may be a console display positioned for use by the driver and a passenger. The display panel 100*c* may be a passenger display positioned for use by the passenger and the driver.

Figure 2:
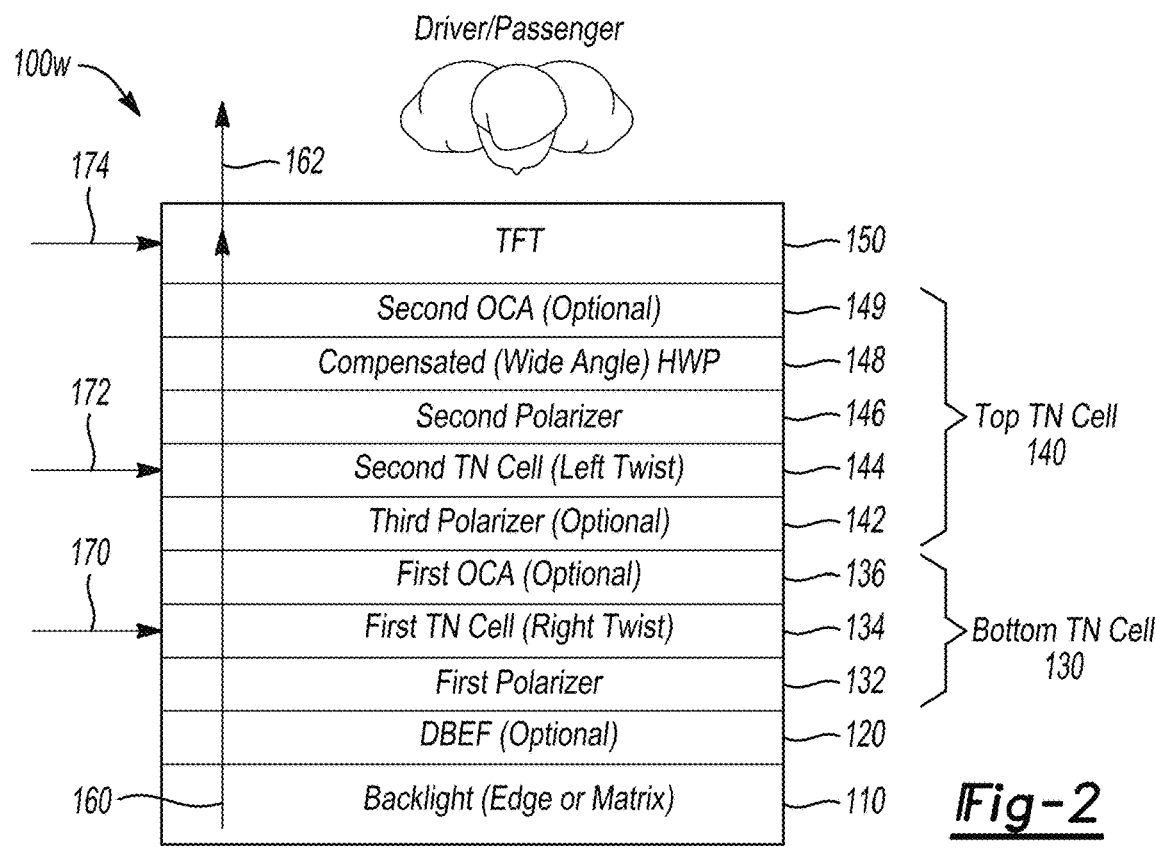
FIG. 2 illustrates a schematic side view of a display panel in accordance with one or more exemplary embodiments.

FIG. 2 illustrates a schematic side view of an example implementation of a display panel 100*w* in accordance with one or more exemplary embodiments. The display panel 100*w* may be representative of one or more of the display panels 100*a*-100*c*. The display panel 100*w* generally includes a backlight source 110, an optional dual brightness enhancement film (or filter) 120, a bottom twisted nematic cell 130, a top twisted nematic cell 140, and a thin-film transistor display 150.

A light 160 may be generated by the backlight source 110 in a direction normal to a face of the display panel 100*w*. The light 160 is a backlight that generally illuminates the area of the dual brightness enhancement film 120. The light 160 may or may not be polarized. An optical signal 162 is presented from the thin-film transistor display 150. The optical signal 162 may be the light 160 spatially adjusted by the dual brightness enhancement film 120, the bottom twisted nematic cell 130, the top twisted nematic cell 140, and the thin-film transistor display 150. A first control signal 170 is received by the bottom twisted nematic cell 130 from the control unit 94. The first control signal 170 is switchable between a first on state and a first off state. A second control signal 172 is received by the top twisted nematic cell 140 from the control unit 94. The second control signal 172 is switchable between a second on state and a second off state. A display signal 174 is received by the thin-film transistor display 150 from the control unit 94. The display signal 174 conveys a sequence of pictures used to modulate the light 160 to create the optical signal 162.

The backlight source 110 implements an edge backlight source or a matrix backlight source. The backlight source 110 is operational to generate and present the light 160 to the bottom twisted nematic cell 130.

The optional dual brightness enhancement film 120 (DBEF) implements a reflective polarizer used to recycle light and create brighter images in the optical signal 162 and wide angles. The dual brightness enhancement film 120 is mounted to the backlight source 110 and transfers the light 160 from the backlight source 110 to the bottom twisted nematic cell 130. The dual brightness enhancement film 120 is available as 3M™ Dual Brightness Enhancement Film from THE 3M COMPANY, with headquarters located in Maplewood, MN.

The bottom twisted nematic (TN) cell 130 generally includes a first polarizer 132, a first twisted nematic cell 134, and an optional first optically clear adhesive layer 136. The bottom twisted nematic cell 130 is adjacent to the dual brightness enhancement film 120, where implemented, or the backlight source 110. The bottom twisted nematic cell 130 is operational to switch between rotating a polarization of the light 160 received from the dual brightness enhancement film 120/the backlight source 110 and passing the light 160 unrotated for the targeted viewing angles in response to the first control signal 170.

The first polarizer 132 implements a linear polarizer. The first polarizer 132 is mounted to the optional dual brightness enhancement film 120 or to the backlight source 110. The first polarizer 132 transfers the light 160 from the dual brightness enhancement film 120 or to the backlight source 110 to the first twisted nematic cell 134. In various embodiments, the polarization of the first polarizer 132 may match the polarization of the backlight source 110 and/or the dual brightness enhancement film 120.

The first twisted nematic (TN) cell 134 implements a liquid crystal twisted cell (or retarder cell) controlled by the first control signal 170. The first twisted nematic cell 134 is mounted to the first polarizer 132 and transfers the light 160 from the first polarizer 132 to the first optically clear adhesive layer 136 or the top twisted nematic cell 140. While the first control signal 170 is in a first off state (e.g., zero volts), the first twisted nematic cell 134 may spatially rotate the polarity of the light 160 received from the first polarizer 132 by approximately 90 degrees in a first direction (e.g., a right twist). While the first control signal 170 is in a first on state (e.g., one to several volts), the first twisted nematic cell 134 may pass the light 160 received from the first polarizer 132 without spatially altering (e.g., maintaining) the polarity at the off viewing privacy angle (e.g., the at the off viewing privacy angle the optical signal 162 is extinguished.

The first optically clear adhesive layer 136 implements a transparent glue that couples the first twisted nematic cell 134 to the top twisted nematic cell 140.

The top twisted nematic cell 140 generally includes an optional third polarizer 142, a second twisted nematic cell 144, a second polarizer 146, an optional compensated half-wave plate 148, and an optional second optically clear adhesive layer 149. The top twisted nematic cell 140 is operational to switch between rotating the polarization of the light 160 received from the bottom twisted nematic cell 130 and passing the light 160 unrotated at the privacy angles in response to the second control signal 172.

The optional third polarizer 142 implements a linear polarizer. The third polarizer 142 is mounted to the first twisted nematic cell 134 by the first optically clear adhesive layer 136, where implemented, or the first twisted nematic cell 134. A polarity of the third polarizer 142 may be orthogonally aligned with the polarity of the first polarizer 132. The third polarizer 142 transfers the light 160 from the bottom twisted nematic cell 130 to the second twisted nematic cell 144.

The second twisted nematic cell 144 implements another liquid crystal twisted cell (or retarder cell) controlled by the second control signal 172. The second twisted nematic cell 144 is mounted to the optional third polarizer 142, the optional first optically clear adhesive layer 136, or on the first twisted nematic cell 134. While the second control signal 172 is in a second off state (e.g., zero volts), the second twisted nematic cell 144 may spatially rotate the polarity of the light 160 received from the third polarizer 142 by approximately 90 degrees in a second direction (e.g., a left twist). The second direction twist of the second twisted nematic cell 144 is generally opposite the first direction twist of the first twisted nematic cell 134. While the second control signal 172 is in a second on state (e.g., one to several volts), the second twisted nematic cell 144 may pass the light 160 received from the third polarizer 142 without spatially altering (e.g., maintaining) the polarity at the privacy angles.

The second polarizer 146 implements another linear polarizer. The second polarizer 146 is mounted on the second twisted nematic cell 144. The second polarizer 146 transfers the light 160 from second twisted nematic cell 144 to the compensated half-wave plate 148. In various embodiments, the polarization of the second polarizer 146 may match the polarization of the first polarizer 132. In various embodiments, a power efficiency may be improved by use of a reflective input polarizer for the first polarizer 132 and removing the second polarizer 146 and/or the third polarizer 142.

The compensated half-wave plate 148 is mounted to the second polarizer 146. The half-wave plate 148 may be operational to adjust the output polarization of the light 160 to match the appropriate input polarization of the thin-film transistor display 150. The compensated half-wave plate 148 may also improve power efficiency in the optical signal 162. The compensated half-wave plate 148 may include, for instance, alternating negative and positive half-wave plate films or additional compensation layers (e.g., negative C plate or similar). A reduction in a color shift may be achieved by use of a wide angle type compensated half-wave plate 148 that may include additional compensation layers and/or alternating wave plate layers. The compensated half-wave plate 148 transfers the light 160 from the second polarizer 146 to the thin-film transistor display 150.

The second optically clear adhesive layer 149 implements a transparent glue that couples the compensated half-wave plate 148 to the thin-film transistor display 150.

The thin-film transistor display 150 implements a transmissive display. The thin-film transistor display 150 is mounted adjacent to the top twisted nematic cell 140. The thin-film transistor display 150 is operational to modulate the light 160 as received from the top twisted nematic cell 140. The modulation may be a change in opaqueness in different areas as controlled by the display signal 174. The changes in opaqueness generally modulate the intensity and the color to generate the pictures in the optical signal 162. The thin-film transistor display 150 may be a color display or a black-and-white display. Other transmissive display technologies may be implemented to meet the design criteria of a particular application.

Each of the bottom twisted nematic cell 130 and the top twisted nematic cell 140 is electrically controlled, allowing to change the state between wide-angle fully transmissive while no voltage is applied (e.g., the OFF state/public viewing mode) and restricted viewing angle range while voltages are applied (e.g., the ON state/private viewing mode). Each of the bottom twisted nematic cell 130 and the top twisted nematic cell 140 configurations have crossed input and output polarizers. At zero volts applied across the first twisted nematic cell 134 and zero volts applied across the second twisted nematic cell 144, the polarization is rotated by 90 degrees and the light 160 is transmitted through at wide viewing angles. While a voltage is applied, the liquid crystals are rearranged and the polarization rotation occurs efficiently only in the limited incidence angle range, resulting in the light 160 being extinguished in some viewing angles. As the first twisted nematic cell 134 and the second twisted nematic cell 144 have the opposite twist angles, the input polarization and the output polarization between the two closely match and self-compensate in color shift variations as a function of viewing angle is achieved. In various embodiments, the first control signal 170 and the second control signal 172 may be the same where both the first twisted nematic cell 134 and the second twisted nematic cell 144 are controlled simultaneously. In other embodiments, the first control signal 170 and the second control signal 172 may be generated independent of each other.

Figure 3:
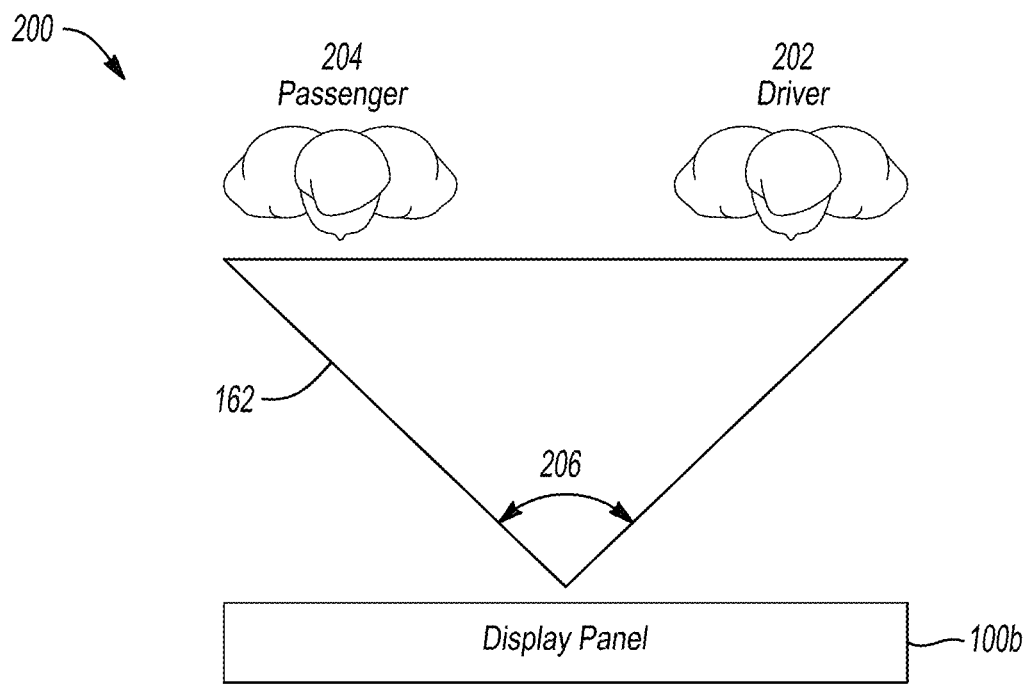
FIG. 3 illustrates a plan schematic diagram of a public viewing mode in accordance with one or more exemplary embodiments.

FIG. 3 illustrates a plan schematic diagram of an example public viewing mode 200 in accordance with one or more exemplary embodiments. The example is illustrated using the display panel 100*b*. While in the public viewing mode 200, the display panel 100*b* may present the optical signal 162 in a public (wide) viewing angle 206 allowing both a driver 202 and a passenger 204 in the vehicle 93 (FIG. 1) to view pictures on the display panel 100*b*. Similar public viewing modes 200 may be applied to the display panels 100*a* and 100*c*.

Figure 4:
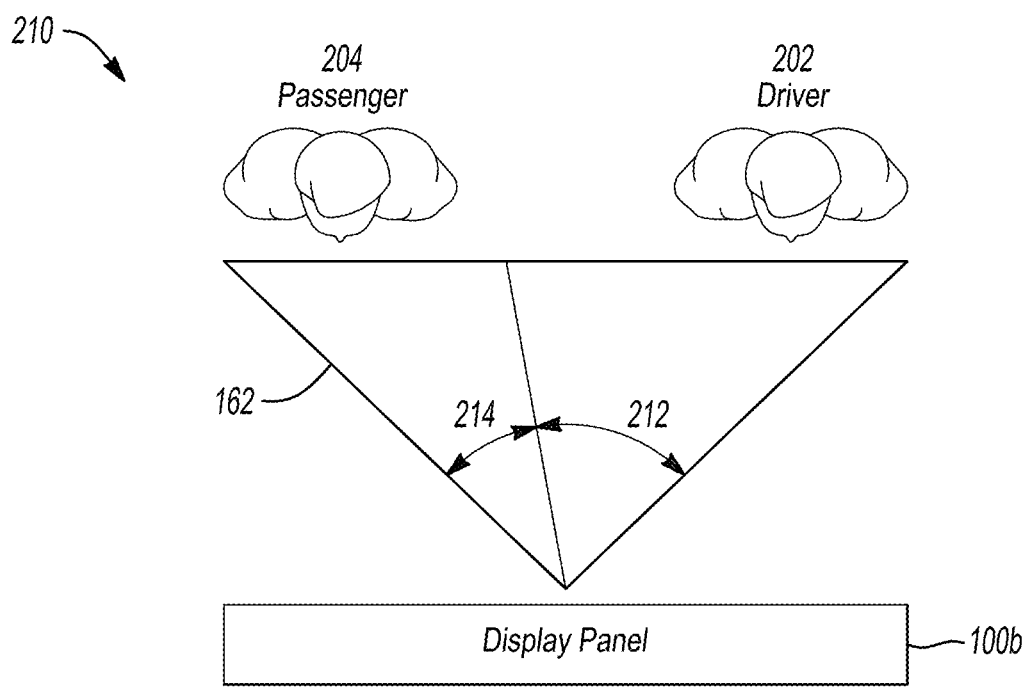
FIG. 4 illustrates a plan schematic diagram of a private viewing mode in accordance with one or more exemplary embodiments.

FIG. 4 illustrates a plan schematic diagram of an example private viewing mode 210 in accordance with one or more exemplary embodiments. The example is illustrated using the display panel 100*b*. While in the private viewing mode 210, the display panel 100*b* may present the optical signal 162 within a private (limited) viewing angle 212 allowing the driver 202 to view pictures on the display panel 100*b*. At the same time, the display panel 100*b* may extinguish the optical signal 162 within a restricted viewing angle 214 directed toward the passenger 204. The restricted viewing angle 214 is narrower than the private viewing angle 212. The private viewing angle 212 is narrower than the public viewing angle 206. Similar private viewing modes 210 may be applied to the display panels 100*a* and 100*c*. In various embodiments, the positions of the driver 202 and the passenger 204 may be switched such that the passenger 204 is to the left of the driver 202. In some embodiments, the direction of the limited viewing angle 212 and the restricted viewing angle 214 may be reversed such that the passenger 204 may see the optical signal 162 while the driver 202 does not.

Figure 5:
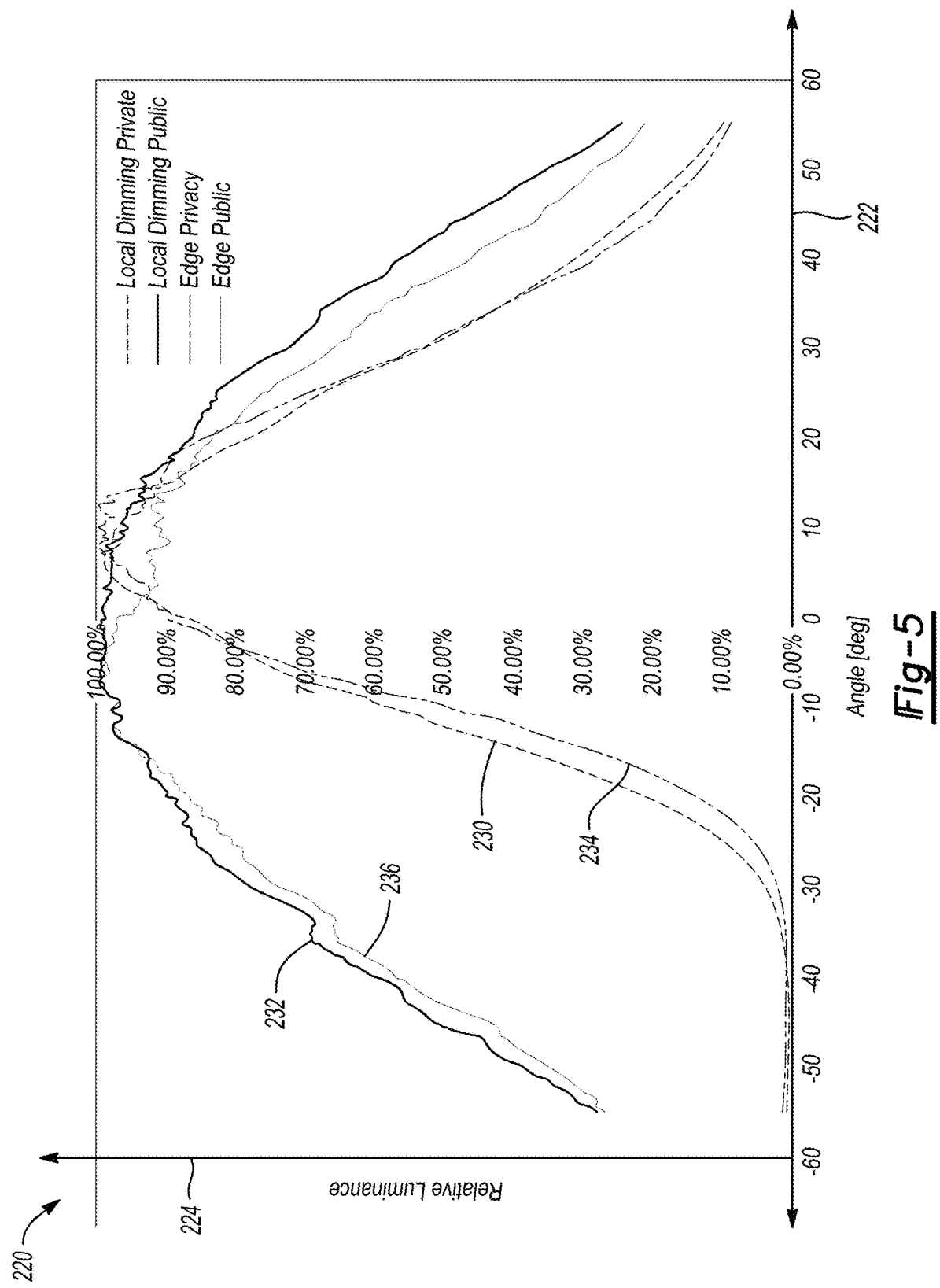
FIG. 5 illustrates a graph of luminance amplitude profiles for both modes of operation in accordance with one or more exemplary embodiments.

FIG. 5 illustrates a graph 220 of example luminance amplitude profiles for both modes of operation in accordance with one or more exemplary embodiments. The graph 220 generally includes an X-axis 222 and a Y-axis 224. The X-axis 222 indicates an angle offset from a center normal of a display panel 100*a*-100*c*. The Y-axis 224 indicates a relative luminance percentage as a function of the angle.

A curve 230 illustrates the luminance in the private viewing mode 210 where the display panel 100*a*-100*c* is implemented with a matrix-type backlight source 110. A curve 232 illustrates the luminance in the public viewing mode 200 where the display panel 100*a*-100*c* is implemented with the matrix-type backlight source 110.

A curve 234 illustrates the luminance in the private viewing mode 210 where the display panel 100*a*-100*c* is implemented with an edge-type backlight source 110. A curve 236 illustrates the luminance in the public viewing mode 200 where the display panel 100*a*-100*c* is implemented with the edge-type backlight source 110. A positive offset angle of the peaks of the private viewing mode curves 230 and 234 from the zero angle may be due to a liquid crystal birefringent characteristic. The birefringent characteristic means that the liquid crystal has two different indices of refraction. One index of refraction corresponds to light polarized along a director of the liquid crystal, and the other is for light polarized perpendicular to the director. In some embodiments, the offset may be moved to a negative angle by mechanically rotating the first twisted nematic cell 134 and the second twisted nematic cell 144 by 180 degrees.

Figure 6:
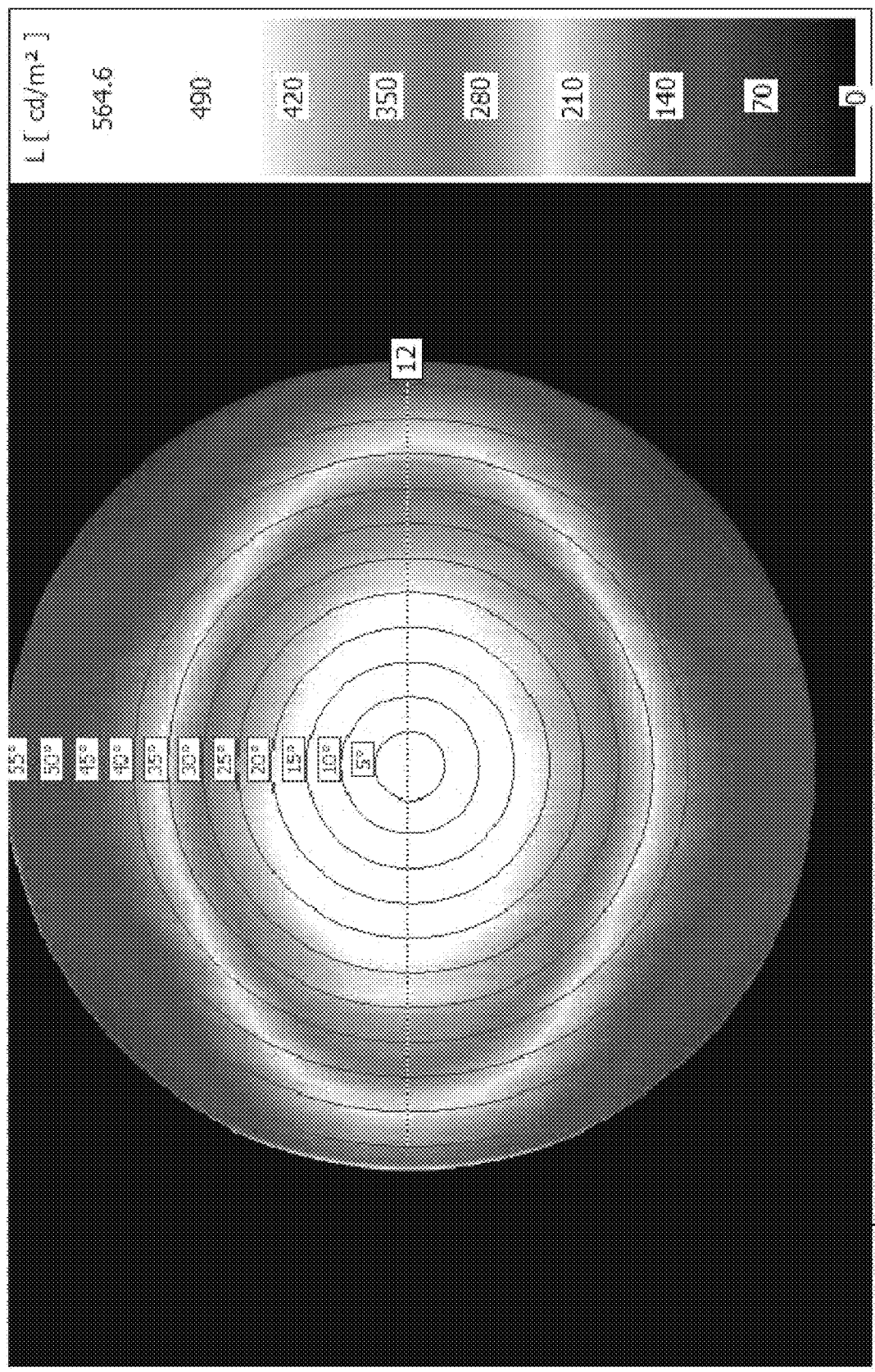
FIG. 6 illustrates a diagram of a spatial luminance profile in the public viewing mode in accordance with one or more exemplary embodiments.

FIG. 6 illustrates a diagram 240 of an example spatial luminance profile in the public viewing mode 200 in accordance with one or more exemplary embodiments. The diagram 240 illustrates a brightest luminance at a center of the profile (e.g., zero degrees). The luminance decreases spatially at greater angles in each direction. The oval shape of the profile is generally due to the rectangular shape of the display panels 100*a*-100*c*.

Figure 7:
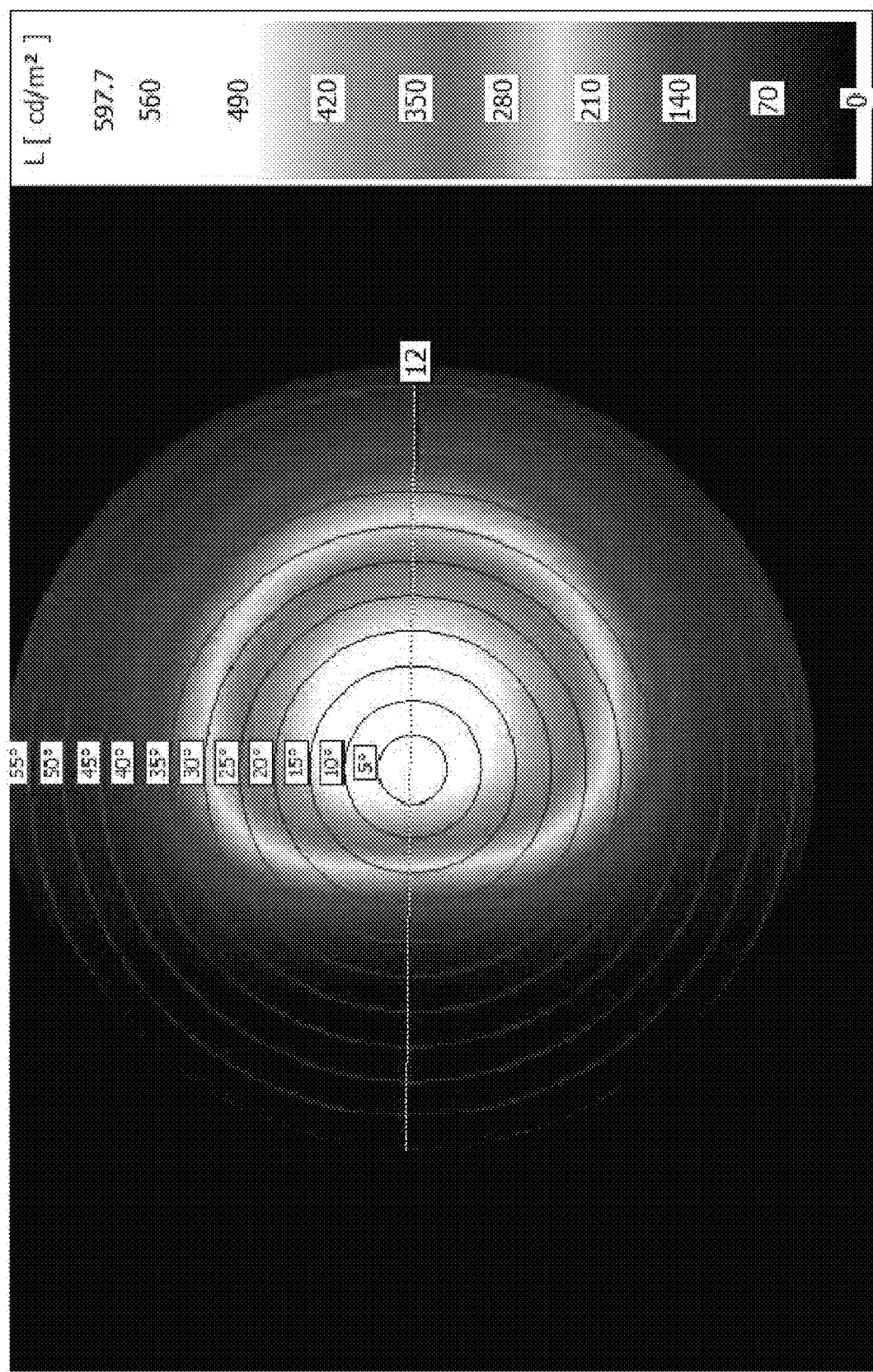
FIG. 7 illustrates a diagram of a spatial luminance profile in the private viewing mode in accordance with one or more exemplary embodiments.

FIG. 7 illustrates a diagram 250 of an example spatial luminance profile in the private viewing mode 210 in accordance with one or more exemplary embodiments. The diagram 250 illustrates a brightest luminance at a center of the profile (e.g., zero degrees). The luminance decreases spatially at a higher rate to one side of the center than the other side. The darker side illustrates the restricted viewing angle 214 (FIG. 4) while the brighter side illustrates the limited viewing angle 212 (FIG. 4).

Figure 8:
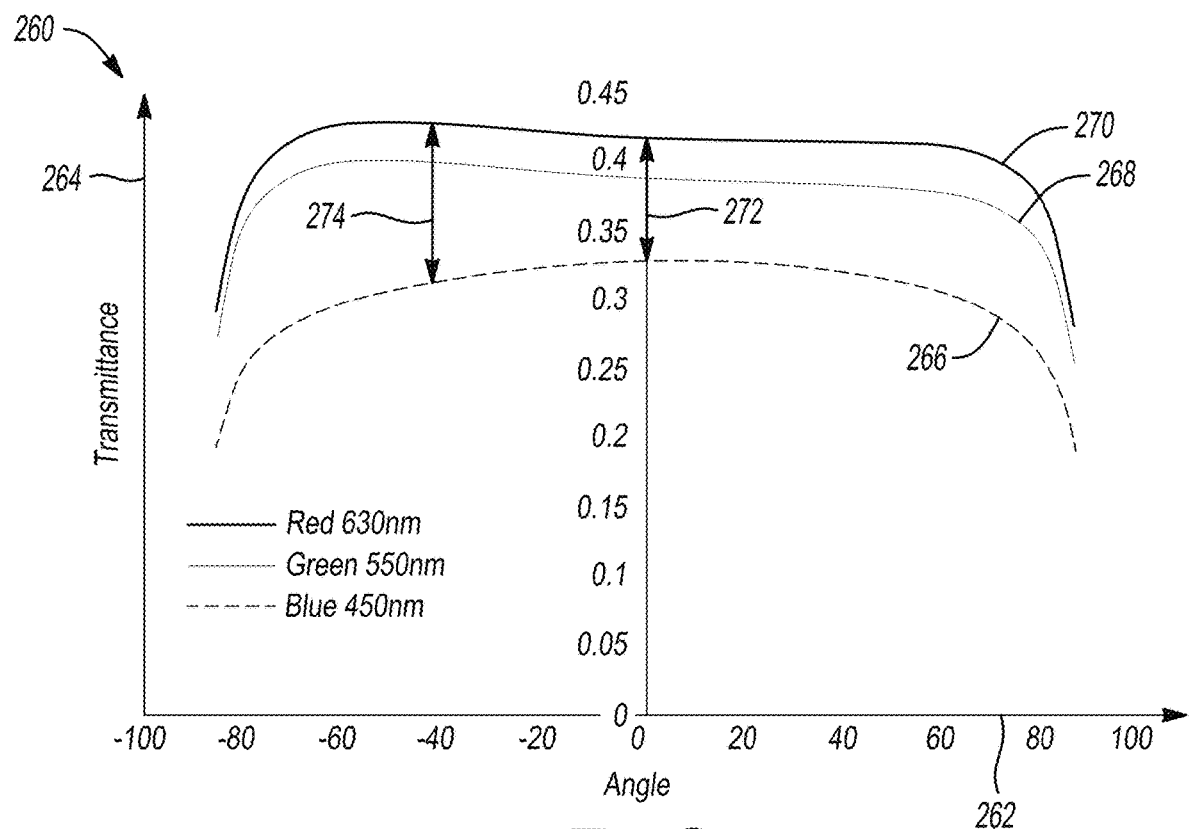
FIG. 8 illustrates a graph of a color shift due to two twisted nematic cells with the same twist in accordance with one or more exemplary embodiments.

FIG. 8 illustrates a graph 260 of an example color shift due to two twisted nematic cells with the same twist in accordance with one or more exemplary embodiments. The graph 260 has an X-axis 262 and a Y-axis 264. The X-axis 262 indicates an angle offset from a center normal of a display panel 100*a*-100*c*. The Y-axis 264 indicates a relative transmittance as a function of the angle. A curve 266 illustrates a response of blue light as a function of the angle. A curve 268 illustrates a response to green light as a function of the angle. A curve 270 illustrates a response of red light as a function of the angle. At zero degrees, a difference in the response of the red-light curve 270 relative to the blue-light curve 266 is shown by reference number 272. At −45 degrees, the difference between red-light curve 270 relative to the blue-light curve 266 is shown by reference number 274. In the example, the difference 274 is noticeably greater than the difference 272.

Figure 9:
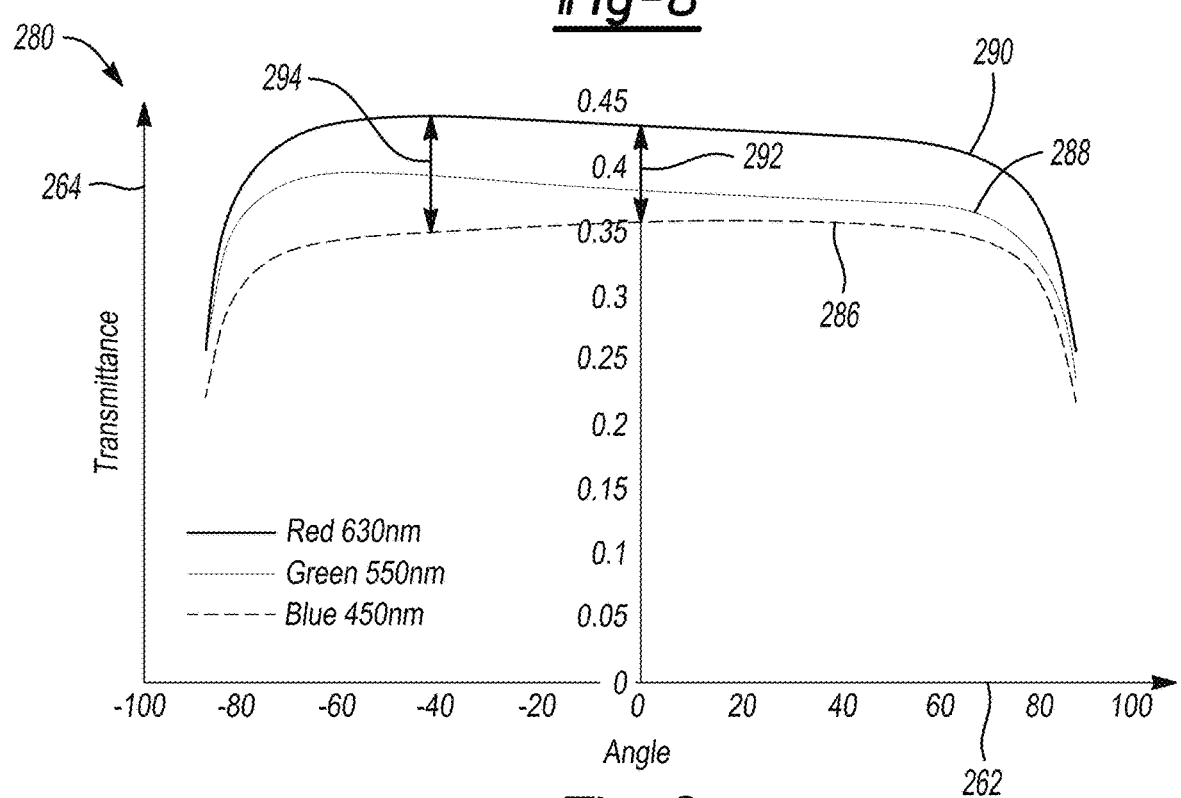
FIG. 9 illustrates a graph of a color shift due to two twisted nematic cells with opposite twists in accordance with one or more exemplary embodiments.

FIG. 9 illustrates a graph 280 of an example color shift due to two twisted nematic cells with opposite twists in accordance with one or more exemplary embodiments. The graph 280 has the X-axis 262 and the Y-axis 264. The X-axis 262 indicates an angle offset from a center normal of a display panel 100*a*-100*c*. The Y-axis 264 indicates a relative transmittance as a function of the angle. A curve 286 illustrates a response of blue light as a function of the angle. A curve 288 illustrates a response to green light as a function of the angle. A curve 290 illustrates a response of red light as a function of the angle. At zero degrees, a difference in the response of the red-light curve 290 relative to the blue-light curve 286 is shown by reference number 292. At −45 degrees, the difference between red-light curve 290 relative to the blue-light curve 286 is shown by reference number 294. In the example, a change from the difference 292 to the difference 294 is less than the change from the difference 272 to the difference 274 shown in FIG. 8.

Figure 10:
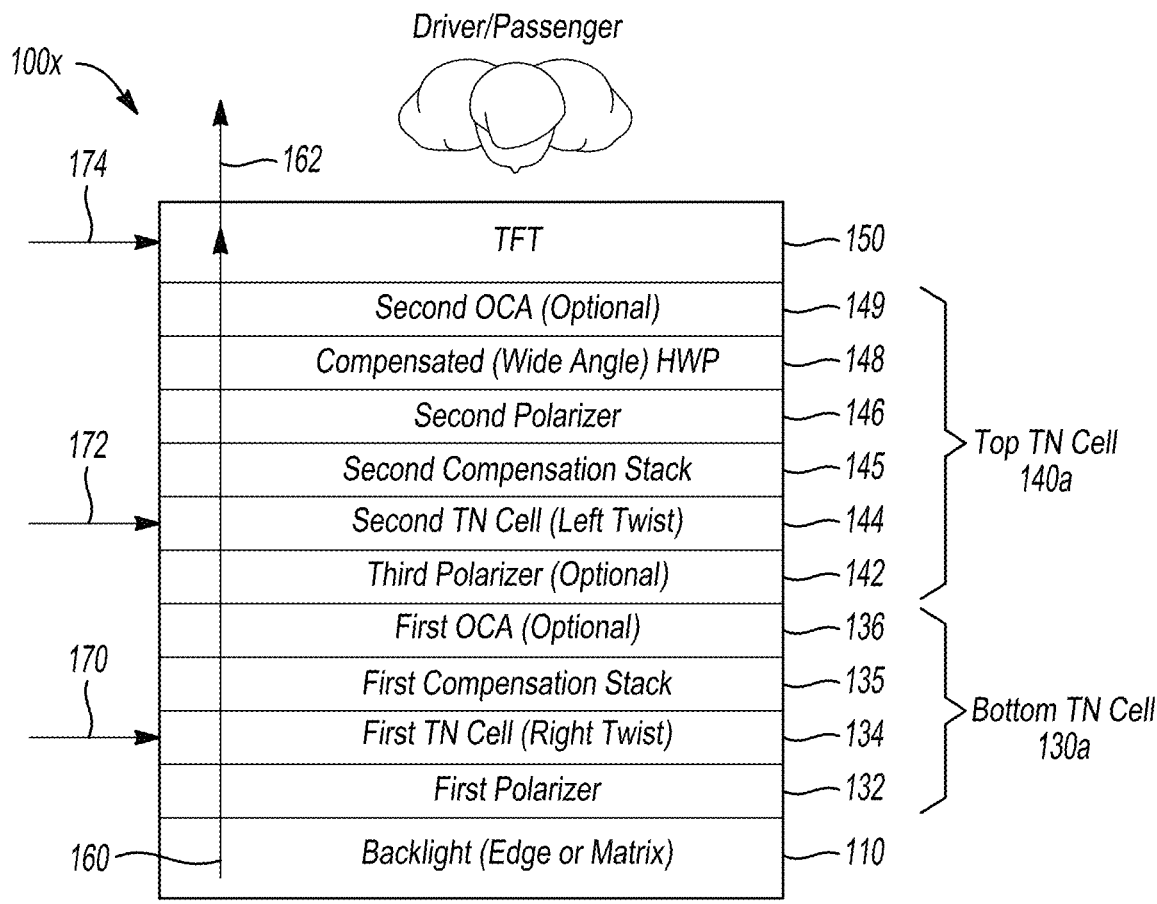
FIG. 10 illustrates a schematic side view of another display panel in accordance with one or more exemplary embodiments.

FIG. 10 illustrates a schematic side view of an example implementation of a display panel 100*x* in accordance with one or more exemplary embodiments. The display panel 100*x* may be a variation of the display panel 100*w*. The display panel 100*x* may be representative of one or more of the display panels 100*a*-100*c*. The display panel 100*x* generally includes the backlight source 110, a bottom twisted nematic cell 130*a*, a top twisted nematic cell 140*a*, and the thin-film transistor display 150. The bottom twisted nematic cell 130*a* may be a variation of the bottom twisted nematic cell 130. The top twisted nematic cell 140*a* may be a variation of the top twisted nematic cell 140.

The bottom twisted nematic (TN) cell 130*a* generally includes the first polarizer 132, the first twisted nematic cell 134, a first compensation stack 135, and the optional first optically clear adhesive layer 136. The bottom twisted nematic cell 130*a* is mounted to the backlight source 110. The bottom twisted nematic cell 130*a* is operational to switch between rotating a polarization of the light 160 received from the backlight source 110 and passing the light 160 unrotated for the targeted viewing angles in response to the first control signal 170.

The first compensation stack 135 may include two or more layers including uniaxial positive A and positive C plates or positive and negative biaxial (B plates). The first compensation stack 135 is mounted adjacent to the first twisted nematic cell 134. The first compensation stack 135 transfers the light 160 from the layer below to the layer above. The first compensation stack 135 may improve active privacy performance by reducing the transmittance at higher viewing angles.

The top twisted nematic cell 140 generally includes the optional third polarizer 142, the second twisted nematic cell 144, a second compensation stack 145, the second polarizer 146, the optional compensated half-wave plate 148, and the optional second optically clear adhesive layer 149. The top twisted nematic cell 140a is operational to switch between rotating the polarization of the light 160 received from the bottom twisted nematic cell 130a and passing the light 160 unrotated at the privacy angles in response to the second control signal 172.

The second compensation stack 145 may include two or more layers including uniaxial positive A and positive C plates or positive and negative biaxial (B plates). The second compensation stack 145 is mounted adjacent to the second twisted nematic cell 144. The second compensation stack 145 transfers the light 160 from the layer below to the layer above. The second compensation stack 145 may improve active privacy performance by reducing the transmittance at higher viewing angles.

The thin-film transistor display 150 is disposed adjacent the compensated half-wave plate 148 or the second optically clear adhesive layer 149. The display signal 174 is received by the thin-film transistor display 150 from the control unit 94. The display signal 174 conveys a sequence of pictures used to modulate the light 160 to create the optical signal 162.

Each of the bottom twisted nematic cell 130a and the top twisted nematic cell 140a is electrically controlled, allowing to change the state between wide-angle highly transmissive state while no voltage is applied (e.g., the OFF state/public viewing mode) and restricted viewing angle state while voltages are applied (e.g., the ON state/private viewing mode). Each of the bottom twisted nematic cell 130a and the top twisted nematic cell 140a configurations have crossed input and output polarizers. At zero volts applied across the first twisted nematic cell 134 and zero volts applied across the second twisted nematic cell 144, the polarization is rotated by 90 degrees and the light 160 is transmitted through at wide viewing angles. When voltage is applied, the liquid crystals are rearranged and the polarization rotation occurs efficiently only in the limited incidence angle range, resulting in the light 160 being extinguished in some viewing angles. As the first twisted nematic cell 134 and the second twisted nematic cell 144 have the opposite twist angles, the input polarization and the output polarization between the two closely matched and self-compensated color shift variations as a function of the viewing angle is achieved. In various embodiments, the first control signal 170 and the second control signal 172 may be the same where both the first twisted nematic cell 134 and the second twisted nematic cell 144 are controlled simultaneously. In other embodiments, the first control signal 170 and the second control signal 172 may be generated independent of each other.

Figure 11:
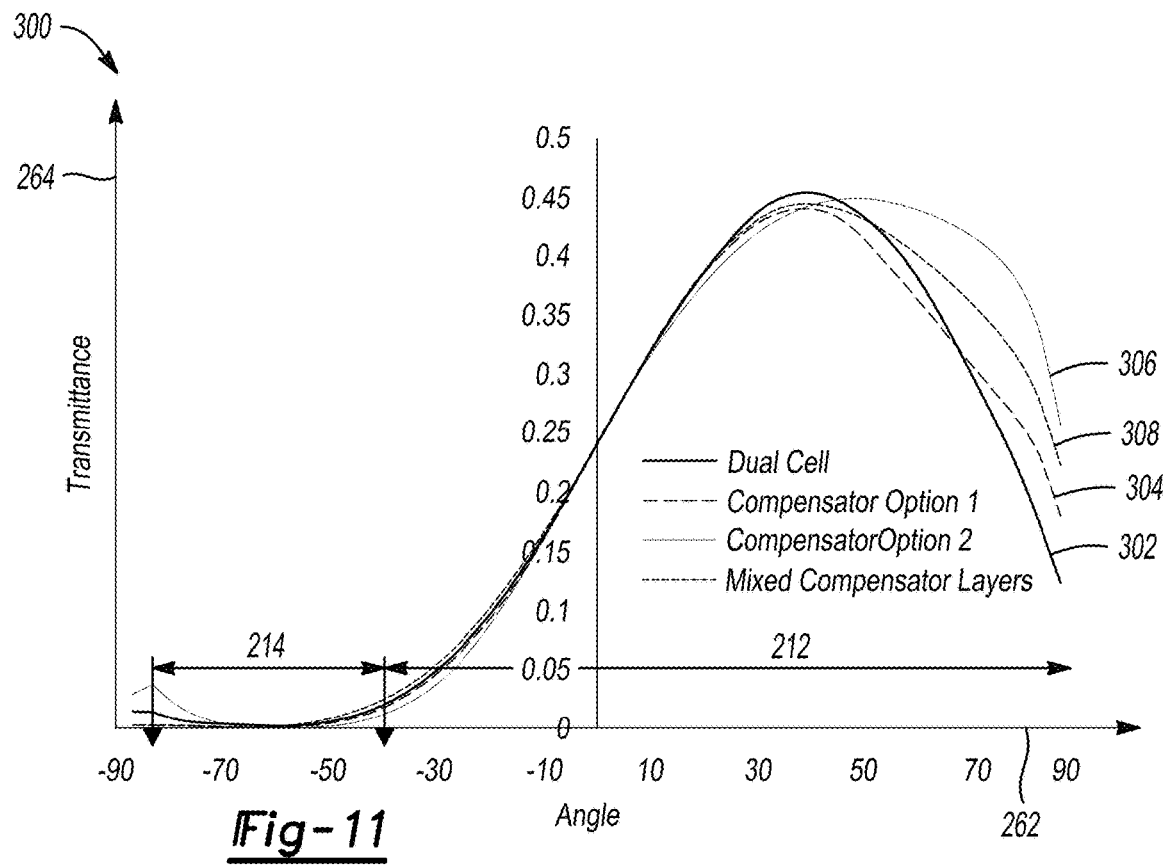
FIG. 11 illustrates a graph of an improvement of the privacy viewing mode caused by the compensation stacks in accordance with one or more exemplary embodiments.

FIG. 11 illustrates a graph 300 of an example improvement of the privacy viewing mode caused by the compensation stacks in accordance with one or more exemplary embodiments. The graph 300 includes the X-axis 262 and the Y-axis 264.

A curve 302 illustrates a dual-TN-cell display panel (e.g., 100w) without the compensation stacks 135 and 145. A curve 304 illustrates the dual-TN-cell display panel with a first optional compensation. A curve 306 illustrates the dual-TN-cell display panel with a second optional compensation. A curve 308 illustrates the dual-TN-cell display panel (e.g., 100x) implementing the first compensation stack 135 and the second compensation stack 145. By adding the compensation, the transmittance in the restricted viewing angle 214 decreases to nearly zero above an approximately 45-degree viewing angle. By increasing the compensation, the transmittance in the limited angle 212 generally increases.

Figure 12:
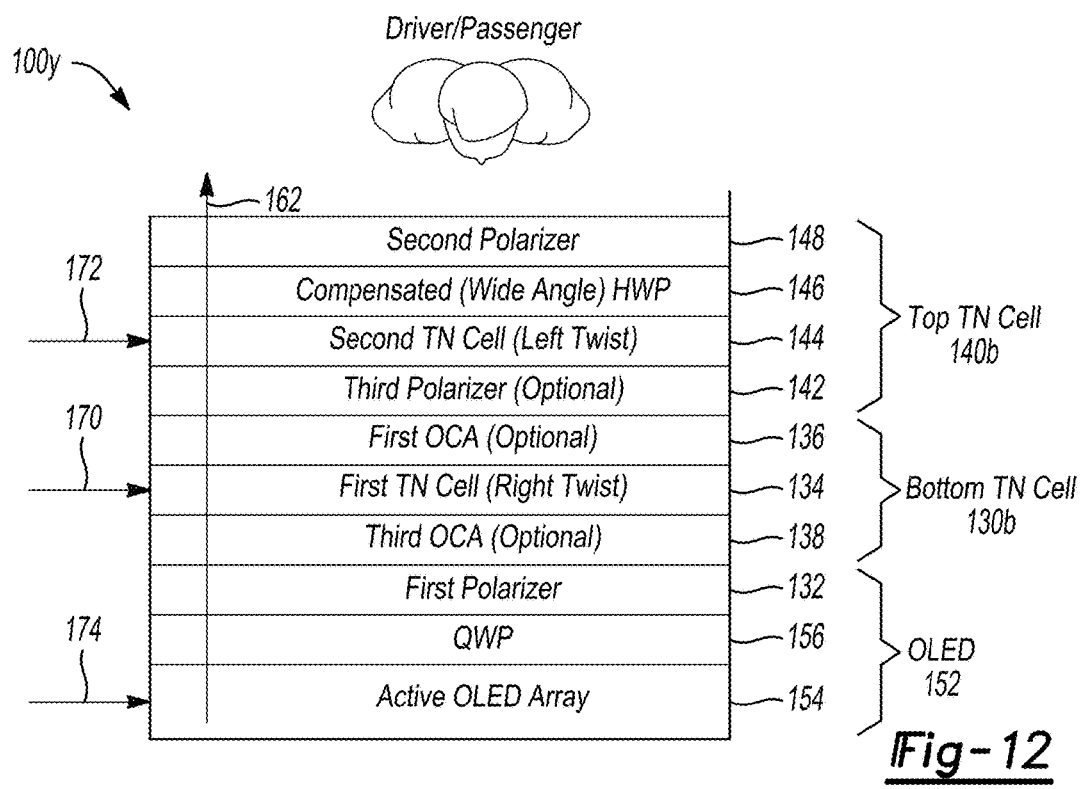
FIG. 12 illustrates a schematic side view of still another display panel in accordance with one or more exemplary embodiments.

FIG. 12 illustrates a schematic side view of an example implementation of a display panel 100y in accordance with one or more exemplary embodiments. The display panel 100y may be a variation of the display panels 100w and/or 100x. The display panel 100y may be representative of one or more of the display panels 100a-100c. The display panel 100y generally includes a bottom twisted nematic cell 130b, a top twisted nematic cell 140b, and an organic light-emitting diode (OLED) display 152. The bottom twisted nematic cell 130b may be a variation of the bottom twisted nematic cells 130 and/or 130a. The top twisted nematic cell 140b may be a variation of the top twisted nematic cells 140 and/or 140a.

The optical signal 162 may be generated by the organic light-emitting diode display 152. The first control signal 170 is received by the bottom twisted nematic cell 130b from the control unit 94. The first control signal 170 is switchable between the first on state and the first off state. The second control signal 172 is received by the top twisted nematic cell 140b from the control unit 94. The second control signal 172 is switchable between the second on state and the second off state. The display signal 174 is received by the organic light-emitting diode display 152 from the control unit 94. The display signal 174 conveys a sequence of pictures used to create the optical signal 162.

The bottom twisted nematic (TN) cell 130b generally includes the first twisted nematic cell 134, an optional first optically clear adhesive layer 136, and an optional third optically clear adhesive layer 138. The bottom twisted nematic cell 130b is mounted to the organic light-emitting diode display 152. The bottom twisted nematic cell 130b is operational to switch between rotating a polarization of the optical signal 162 received from the organic light-emitting diode display 152 and passing the optical signal 162 unrotated for the targeted viewing angles in response to the first control signal 170.

The third optically clear adhesive layer 138 implements a transparent glue that couples the first twisted nematic cell 134 to the organic light-emitting diode display 152.

The top twisted nematic cell 140b generally includes the optional third polarizer 142, the second twisted nematic cell 144, the second polarizer 146, and the optional compensated half-wave plate 148. The top twisted nematic cell 140b is operational to switch between rotating the polarization of the optical signal 162 received from the bottom twisted nematic cell 130b and passing the optical signal 162 unrotated at the privacy angles in response to the second control signal 172.

The organic light-emitting diode display 152 generally include an active organic light-emitting diode array 154, a quarter-wave plate (QWP) 156, and the first polarizer 132. The organic light-emitting diode display 152 is mounted adjacent to the bottom twisted nematic cell 130b.

The active organic light-emitting diode array 154 implements a two-dimensional light-emitting display. The active organic light-emitting diode array 154 is operational to generate the optical signal 162 in response to the display signal 174.

The quarter-wave plate 156 is mounted adjacent to the active organic light-emitting diode array 154. A function of the quarter-wave plate 156 is to rotate the light incident on the display panel, such as sunlight, and rotate the reflected light from the organic light-emitting diode display 152 by 180 degrees (e.g., two 90 degree rotations) and cancel the reflected components. This is done because organic light-emitting diode displays are reflective by nature.

Each of the bottom twisted nematic cell 130b and the top twisted nematic cell 140b is electrically controlled, allowing to change the state between wide-angle fully transmissive while no voltage is applied (e.g., the OFF state/public viewing mode) and restricted viewing angle range while voltages are applied (e.g., the ON state/private viewing mode). Each of the bottom twisted nematic cell 130b and the top twisted nematic cell 140b configurations have crossed input and output polarizers. At zero volts applied across the first twisted nematic cell 134 and zero volts applied across the second twisted nematic cell 144, the polarization is rotated by 90 degrees and the light 160 is transmitted through at wide viewing angles. While a voltage is applied, the liquid crystals are rearranged and the polarization rotation occurs efficiently only in the limited incidence angle range, resulting in the optical signal 162 being extinguished in some viewing angles. As the first twisted nematic cell 134 and the second twisted nematic cell 144 have the opposite twist angles, the input polarization and the output polarization between the two closely matched and self-compensated color shift variations as a function of viewing angle is achieved. In various embodiments, the first control signal 170 and the second control signal 172 may be the same where both the first twisted nematic cell 134 and the second twisted nematic cell 144 are controlled simultaneously. In other embodiments, the first control signal 170 and the second control signal 172 may be generated independent of each other.

To improve the efficiency, the first polarizer 132 may be modified to be aligned (or oriented) with twisted nematic stack (e.g., 130b and 140b) at various angles (e.g., 45 degrees or 135 degrees). If a vertical output is specified from the display panel 100y (e.g., 45 degrees or 135 degrees is not permitted) a half wave plate may be added to the stack to achieve the intended output. Additional privacy performance improvements may be achieved by incorporating additional compensation stacks (e.g., 135 and 145 in FIG. 10).

Figure 13:
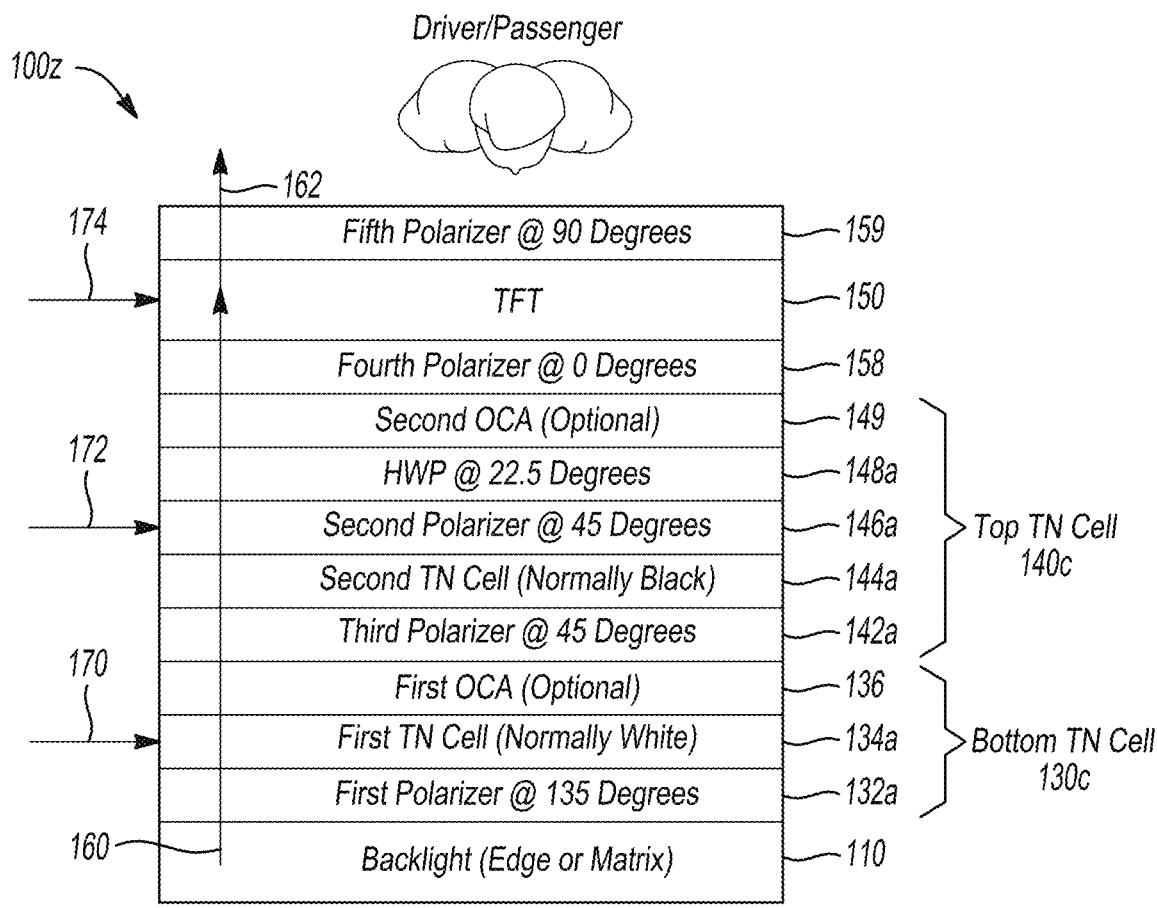
FIG. 13 illustrates a schematic side view of another display panel in accordance with one or more exemplary embodiments.

FIG. 13 illustrates a schematic side view of an example implementation of a display panel 100z in accordance with one or more exemplary embodiments. The display panel 100z may be a variation of the display panels 100w, 100x and/or 100y. The display panel 100z may be representative of one or more of the display panels 100a-100c. The display panel 100z generally includes the backlight source 110, a bottom twisted nematic cell 130c, a top twisted nematic cell 140c, the thin-film transistor display 150, a fourth polarizer 158, and a fifth polarizer 159.

The bottom twisted nematic (TN) cell 130c generally includes a first polarizer 132a, a first twisted nematic cell 134a, and the optional first optically clear adhesive layer 136. The bottom twisted nematic cell 130c is mounted to the backlight source 110. The bottom twisted nematic cell 130c is operational to switch between rotating a polarization of the light 160 received from the backlight source 110 and passing the light 160 unrotated for the targeted viewing angles in response to the first control signal 170.

The first polarizer 132a implements a linear polarizer. The first polarizer 132a may be a variation of the first polarizer 132 (FIG. 2) The first polarizer 132a is mounted to the backlight source 110. The first polarizer 132a transfers the light 160 from the backlight source 110 to the first twisted nematic cell 134. In various embodiments, the polarization of the first polarizer 132a may be rotated to a first angle (e.g., 135 degrees) relative to the polarization of the backlight source 110.

The first twisted nematic (TN) cell 134a implements a liquid crystal twisted cell (or retarder cell) controlled by the first control signal 170. The first twisted nematic cell 134a may be a variation of the first twisted nematic cell 134 (FIG. 2). The first twisted nematic cell 134a is mounted to the first polarizer 132a and transfers the light 160 from the first polarizer 132a to the first optically clear adhesive layer 136 or the top twisted nematic cell 140c. While the first control signal 170 is in a first white state (e.g., zero volts of a first off state), the first twisted nematic cell 134a may spatially rotate the polarity of the light 160 received from the first polarizer 132a by approximately 90 degrees in a third direction (e.g., a normally white direction or normally bright direction). While the first control signal 170 is in a first black state (e.g., one to several volts or a first on state), the first twisted nematic cell 134a may pass the light 160 received from the first polarizer 132a without spatially altering (e.g., maintaining) the polarity (e.g., a black direction or dark direction).

The first optically clear adhesive layer 136 implements a transparent glue that couples the first twisted nematic cell 134 to the top twisted nematic cell 140.

The top twisted nematic cell 140c generally includes a third polarizer 142a, a second twisted nematic cell 144a, a second polarizer 146a, an optional compensated half-wave plate 148a, and an optional second optically clear adhesive layer 149. The top twisted nematic cell 140c is operational to switch between rotating the polarization of the light 160 received from the bottom twisted nematic cell 130c and passing the light 160 unrotated at the privacy angles in response to the second control signal 172.

The third polarizer 142a implements a linear polarizer. The third polarizer 142a may be a variation of the third polarizer 142 (FIG. 2). The third polarizer 142a is mounted to the first twisted nematic cell 134a by the first optically clear adhesive layer 136, where implemented, or directly the first twisted nematic cell 134a. A polarity of the third polarizer 142a may be rotated (or oriented) to a third angle (e.g., 45 degrees) relative to the polarization of the backlight source 110. The third polarizer 142a transfers the light 160 from the bottom twisted nematic cell 130c to the second twisted nematic cell 144a.

The second twisted nematic cell 144a implements another liquid crystal twisted cell (or retarder cell) controlled by the second control signal 172. The second twisted nematic cell 144a may be a variation of the second twisted nematic cell 144 (FIG. 2). The second twisted nematic cell 144a is mounted to the third polarizer 142a. While the second control signal 172 is in a second white state (e.g., a second on state), the second twisted nematic cell 144 does not rotate the polarity of the light 160 received from the third polarizer 142. While the second control signal 172 is in an intermediate state (e.g., partially transmitting of second off state), the second twisted nematic cell 144a may pass the light 160 received from the third polarizer 142 without spatially altering (e.g., maintaining) the polarity in the angular range.

The second polarizer 146a implements another linear polarizer. The second polarizer 146a may be a variation of the second polarizer 146 (FIG. 2). The second polarizer 146a is mounted on the second twisted nematic cell 144a. The second polarizer 146a transfers the light 160 from the second twisted nematic cell 144a to the compensated half-wave plate 148a. In various embodiments, the polarization of the second polarizer 146a may have a second angle (e.g., 45 degrees) relative to the polarization of the backlight source 110.

The compensated half-wave plate 148a is mounted to the second polarizer 146a. The compensated half-wave plate 148a may be a variation of the compensated half-wave plate 148 (FIG. 2). The compensated half-wave plate 148a may be operational to adjust the output polarization of the light 160 to match the input polarization of the light 160. A direction of polarization of the compensated half-wave plate 148a may be at an angle (e.g., 22.5 degrees) relative to the polarization of the backlight source 110. The compensated half-wave plate 148a may also improve power efficiency in the optical signal 162. The half-compensated wave plate 148a may include, for instance, alternating negative and positive half-wave plate films or additional compensation layers (e.g., negative C plate or similar). A reduction in a color shift may be achieved by use of a wide angle compensated half-wave plate 148a that may include additional compensation layers and/or alternating wave plate layers. The compensated half-wave plate 148a transfers the light 160 from the second polarizer 146a to the fourth polarizer 158.

The second optically clear adhesive layer 149 implements a transparent glue that couples the compensated half-wave plate 148a to the fourth polarizer 158.

The thin-film transistor display 150 implements a transmissive display. The thin-film transistor display 150 is mounted adjacent to the top twisted nematic cell 140. The thin-film transistor display 150 is operational to modulate the light 160 as received from the top twisted nematic cell 140c. The modulation may be a change in opaqueness in different areas as controlled by the display signal 174. The changes in opaqueness generally modulate the intensity and the color to generate the pictures in the optical signal 162. The thin-film transistor display 150 may be a color display or a black-and-white display. Other transmissive display technologies may be implemented to meet the design criteria of a particular application.

The fourth polarizer 158 implements a linear polarizer. The fourth polarizer 158 is mounted to the second optically clear adhesive layer 149. The fourth polarizer 158 transfers the light 160 from the second optically clear adhesive layer 149 to the thin-film transistor display 150. In various embodiments, the polarization of the fourth polarizer 158 may be rotated to a fourth angle (e.g., 0 degrees) relative to the polarization of the backlight source 110.

The fifth polarizer 159 implements a linear polarizer. The fifth polarizer 159 is mounted to the thin-film transistor display 150. The fifth polarizer 159 transfers the optical signal 162 from the thin-film transistor display 150 to the driver and/or the passenger. In various embodiments, the polarization of the fifth polarizer 159 may be rotated to a fifth angle (e.g., 90 degrees) relative to the polarization of the backlight source 110.

Each of the bottom twisted nematic cell 130c and the top twisted nematic cell 140c is electrically controlled, allowing to change the state between wide-angle fully transmissive viewing angle range (e.g., the public viewing mode) and restricted viewing angle range (e.g., the private viewing mode). Each of the bottom twisted nematic cell 130c and the top twisted nematic cell 140c configurations have crossed input and output polarizers. The bottom twisted nematic cell 130c and the top twisted nematic cell 140c may have similar twists or opposite twists that are controlled in opposite modes of operation (e.g., normally black and normally white). The opposite modes and/or opposite twists combined together may compensate for the color shift. In addition to the opposite twists and/or opposite modes of operation, the twisted nematic cells may have different call gaps that contribute to the color compensation. In various embodiments, each of the first twisted nematic cell 134/134a and the second twisted nematic cell 144/144a may a single segment (e.g., full area) being in the ON state or the OFF state. In other embodiments, each of the first twisted nematic cell 134/134a and the second twisted nematic cell 144/144a may have multiple segments (or zones). The various segments generally allow selected areas of the thin-film transistor display 150 and/or the organic light-emitting diode display 152 to be controlled independently such that selected parts of the images may be displayed in the private mode and other parts of the images may be displayed in the public mode.

Figure 14:
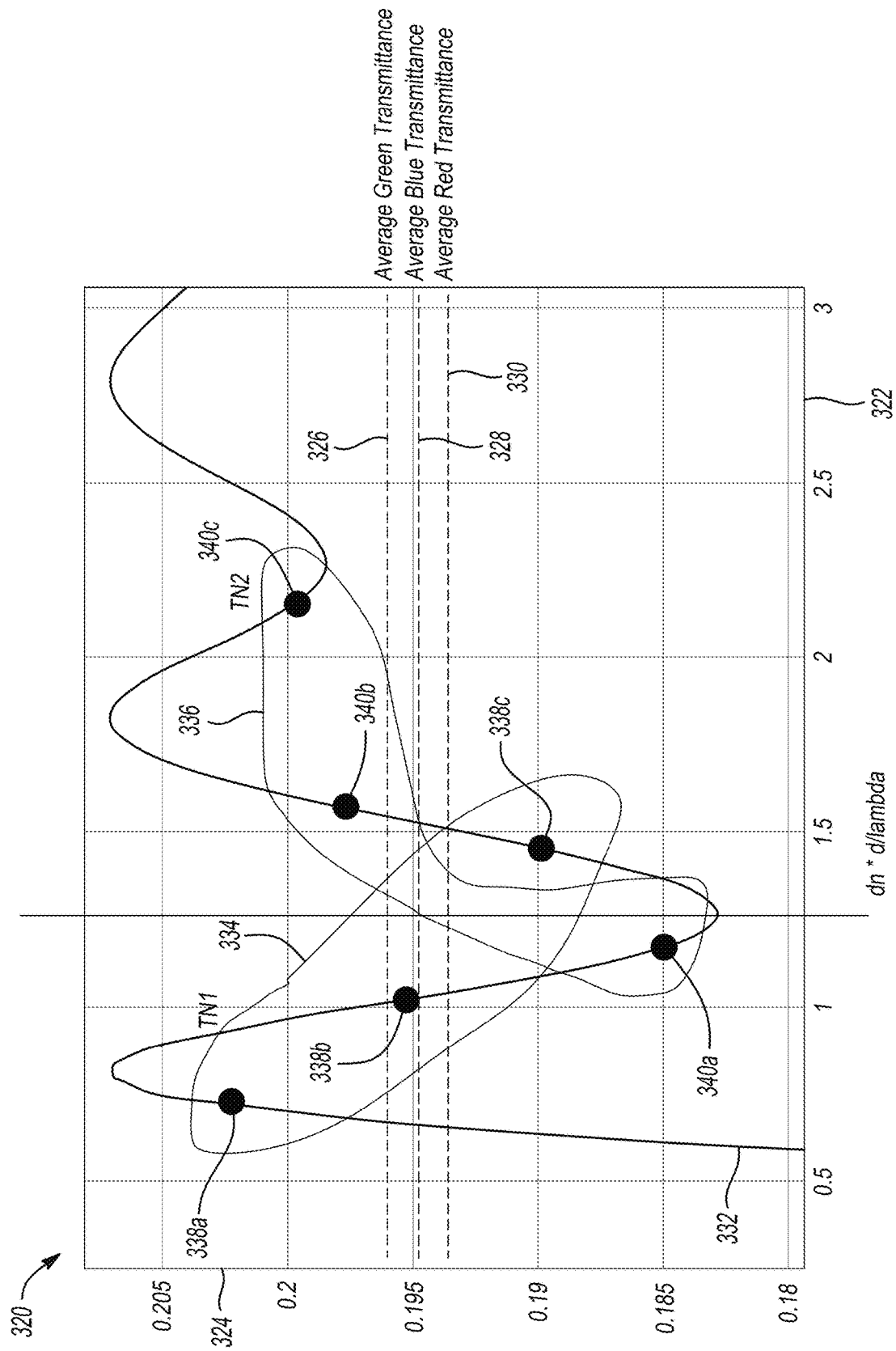
FIG. 14 illustrates a graph of a color improvement due to dual cells with different cell gaps in accordance with one or more exemplary embodiments.

FIG. 14 illustrates a graph 320 of an example color improvement due to dual cells with different cell gaps in accordance with one or more exemplary embodiments. The graph 320 includes an X-axis 322 and a Y-axis 324. The X-axis 322 illustrates the Gooch-Tarry condition (e.g., dn*d/ lambda, where d is a cell gap (e.g., a thickness of a twisted nematic cell), do is an anisotropy of refractive index, and lambda is the wavelength of the radiation). The Y-axis 324 illustrates an intensity ratio.

A curve 332 illustrates the intensity ratio of radiation at a given twist angle as a function of the Gooch-Tarry condition. A twisted nematic liquid crystal retarder (TN1) 334 has a yellow color shift. In the example, the twisted nematic liquid crystal retarder 334 transmits red light 338a, green light 338b, and blue light 338c. Another twisted nematic liquid crystal retarder (TN2) 336 has a blue color shift. The twisted nematic liquid crystal retarder 336 transmits red light 340a, green light 340b, and blue light 340c.

By optimizing cell gaps of the two retarders 334 and 336, arranged in series with opposite color shifts, a total color shift may achieve a neutral color behavior. For example, a line 326 illustrates an average green transmittance through the two twisted nematic liquid crystal retarders 334 and 336. A line 328 illustrates an average blue transmittance through the two twisted nematic liquid crystal retarders 334 and 336. A line 330 illustrates an average red transmittance through the two twisted nematic liquid crystal retarders 334 and 336. The self-compensation may be suitable for the public viewing mode and acceptable in the private viewing mode.

The self-compensation may be applied to the display panels 100w, 100x, 100y, and/or 100z. By way of example, the bottom twisted nematic cell 130 (FIG. 2) may be implemented as the retarder 334 with a first cell gap. The top twisted nematic cell 140 (FIG. 2) may be implemented as the retarder 336 with a second cell gap. The first cell gap may be different than the second cell gap to provide opposing color shift that offset each other.

Figure 15:
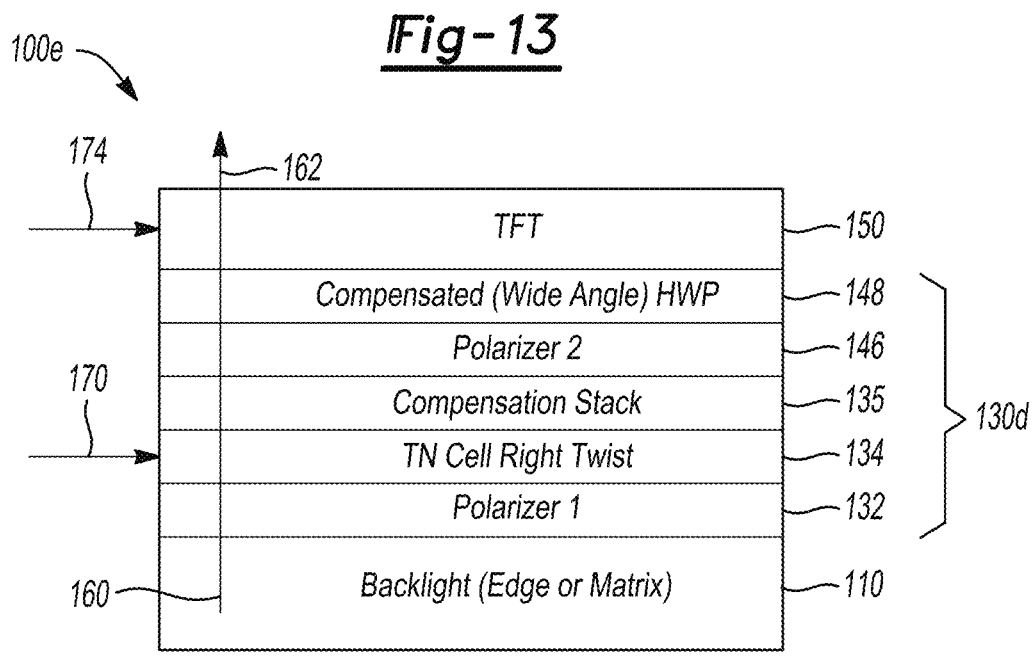
FIG. 15 illustrates a schematic side view of another display panel in accordance with one or more exemplary embodiments.

FIG. 15 illustrates a schematic side view of an example implementation of a display panel 100e in accordance with one or more exemplary embodiments. The display panel 100e may be a variation of the display panels 100w, 100x, 100*y*, and/or 100*z*. The display panel 100*e* may be representative of one or more of the display panels 100*a*-100*c*. The display panel 100*e* generally includes the backlight source 110, a bottom twisted nematic cell 130*d*, and the thin-film transistor display 150. The bottom twisted nematic cell 130*d* may be a variation of the bottom twisted nematic cell 130.

The bottom twisted nematic cell 130*d* is operational to switch between rotating the polarization of the light 160 received from the backlight source 110 and passing the light 160 unrotated for the targeted viewing angles in response to the first control signal 170.

The first compensation stack 135 may include two or more layers including uniaxial positive A and positive C plates or positive and negative biaxial (B plates). The first compensation stack 135 is mounted adjacent to the first twisted nematic cell 134. The first compensation stack 135 transfers the light 160 from the layer below to the layer above. The first compensation stack 135 may improve active privacy performance by reducing the transmittance at higher viewing angles.

The bottom twisted nematic cell 130*d* is electrically controlled, allowing to change the state between wide-angle highly transmissive state while no voltage is applied (e.g., the OFF state/public viewing mode) and restricted viewing angle state while voltages are applied (e.g., the ON state/private viewing mode). The bottom twisted nematic cell 130*d* has crossed input and output polarizers 132 and 146. At zero volts applied across the first twisted nematic cell 134, the polarization is rotated by 90 degrees and the light 160 is transmitted through at wide viewing angles. When voltage is applied, the liquid crystals are rearranged and the polarization rotation occurs efficiently only in the limited incidence angle range, resulting in the light 160 being extinguished in some viewing angles.

The thin-film transistor display 150 is mounted adjacent to the compensated half-wave plate 148. The display signal 174 is received by the thin-film transistor display 150 from the control unit 94. The display signal 174 conveys a sequence of pictures used to modulate the light 160 to create the optical signal 162.

Figure 16:
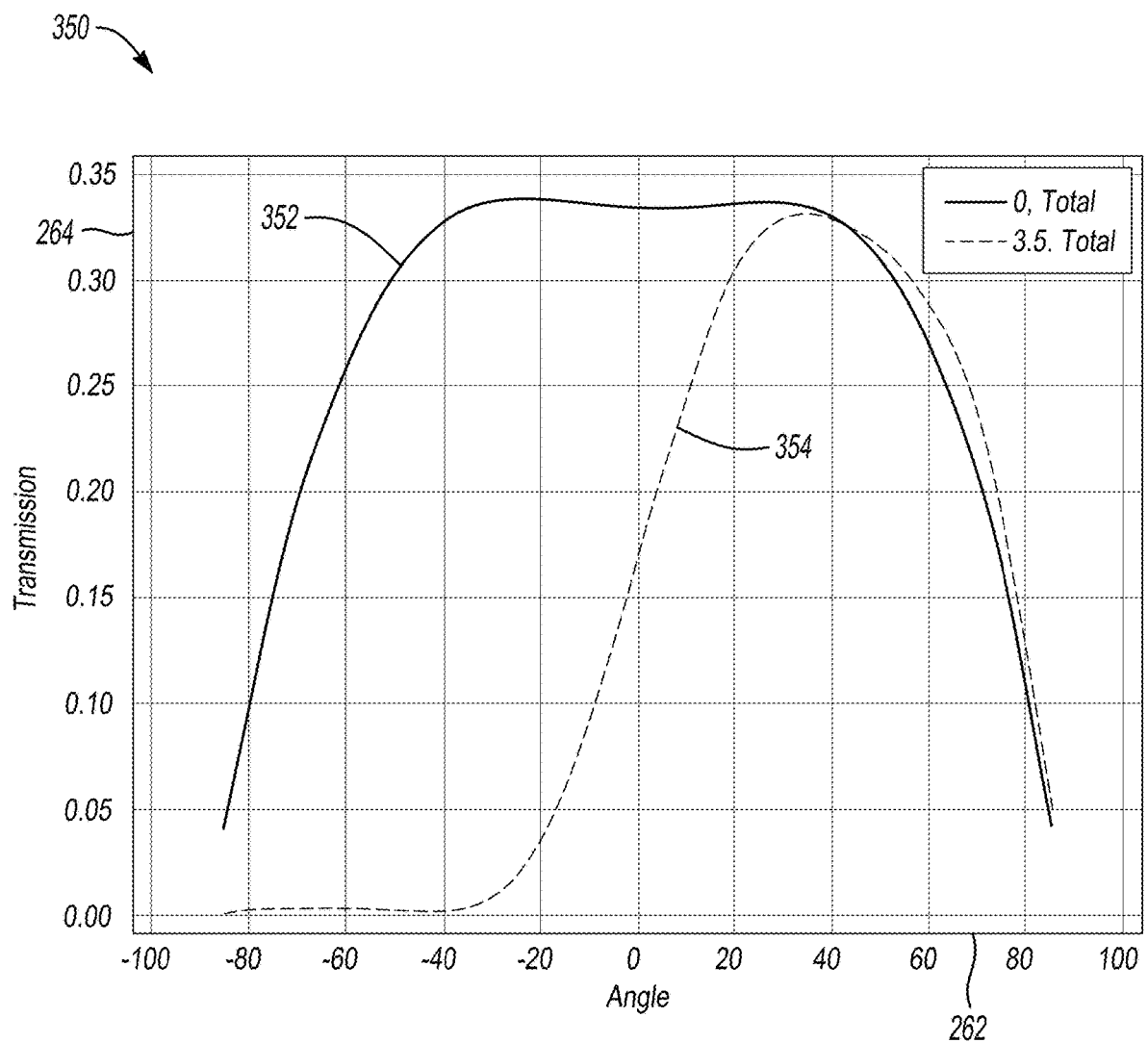
FIG. 16 illustrates a graph of a privacy viewing mode caused by a single twisted nematic cell with a compensation stack in accordance with one or more exemplary embodiments.

FIG. 16 illustrates a graph 350 of an example privacy viewing mode caused by the single twisted nematic cell with the compensation stack in accordance with one or more exemplary embodiments. The graph 350 includes the X-axis 262 and the Y-axis 264.

A curve 352 illustrates a public viewing mode for a single-TN-cell display panel (e.g., 100*e*) with the compensation stack 135. A curve 354 illustrates a private viewing mode for the single-TN-cell display panel with the compensation stack 135. The compensation stack 135 may include combination of uniaxial retardation plates. For instance, the plates may include, but are not limited to, +A/+C and +A/+C/+A, or biaxial material.

Figure 17:
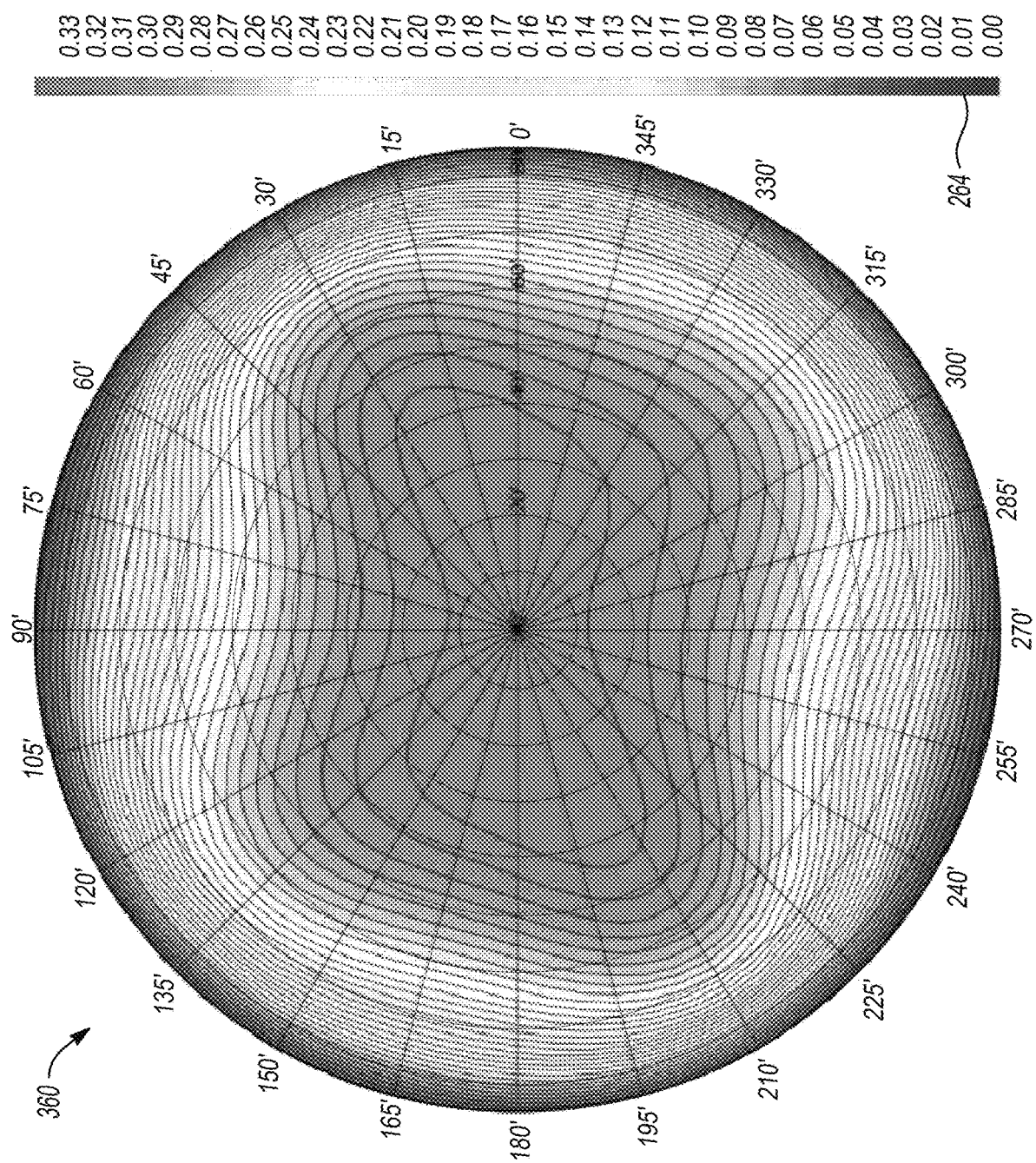
FIG. 17 illustrates a diagram of a spatial luminance profile in a private viewing mode in accordance with one or more exemplary embodiments.

FIG. 17 illustrates a diagram 360 of an example spatial luminance profile in the private viewing mode in accordance with one or more exemplary embodiments. The diagram 360 illustrates uniform luminance visibility from all viewing angles.

Figure 18:
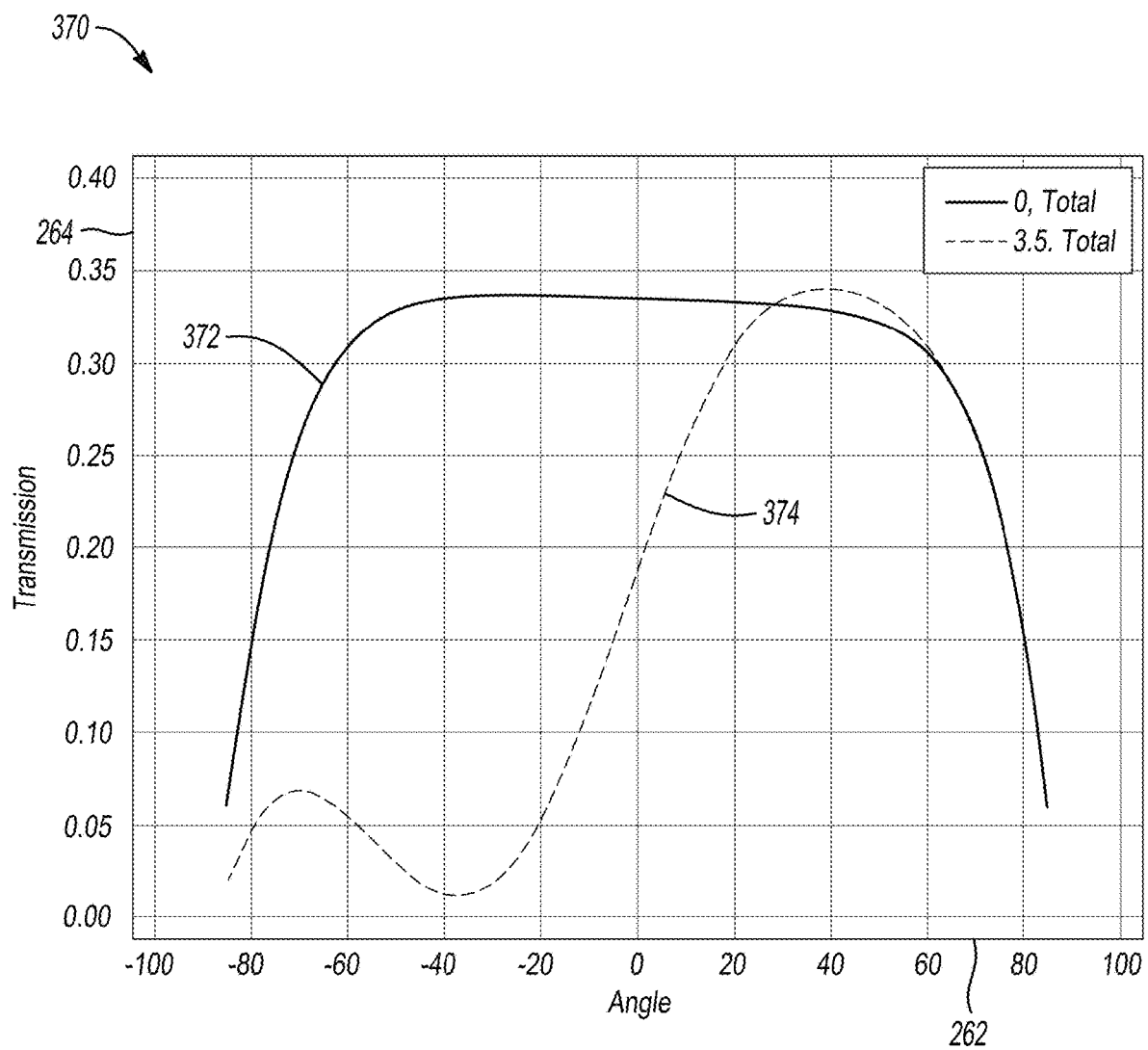
FIG. 18 illustrates a graph of another privacy viewing mode caused by the single twisted nematic cells without the compensation stack in accordance with one or more exemplary embodiments.

FIG. 18 illustrates a graph 370 of an example privacy viewing mode caused by the single twisted nematic cells without the compensation stack in accordance with one or more exemplary embodiments. The graph 370 includes the X-axis 262 and the Y-axis 264.

A curve 372 illustrates a public viewing mode for a single-TN-cell display panel (e.g., 100*e*) without the compensation stack 135. A curve 374 illustrates a private viewing mode for the single-TN-cell display panel without the compensation stack 135.

Figure 19:
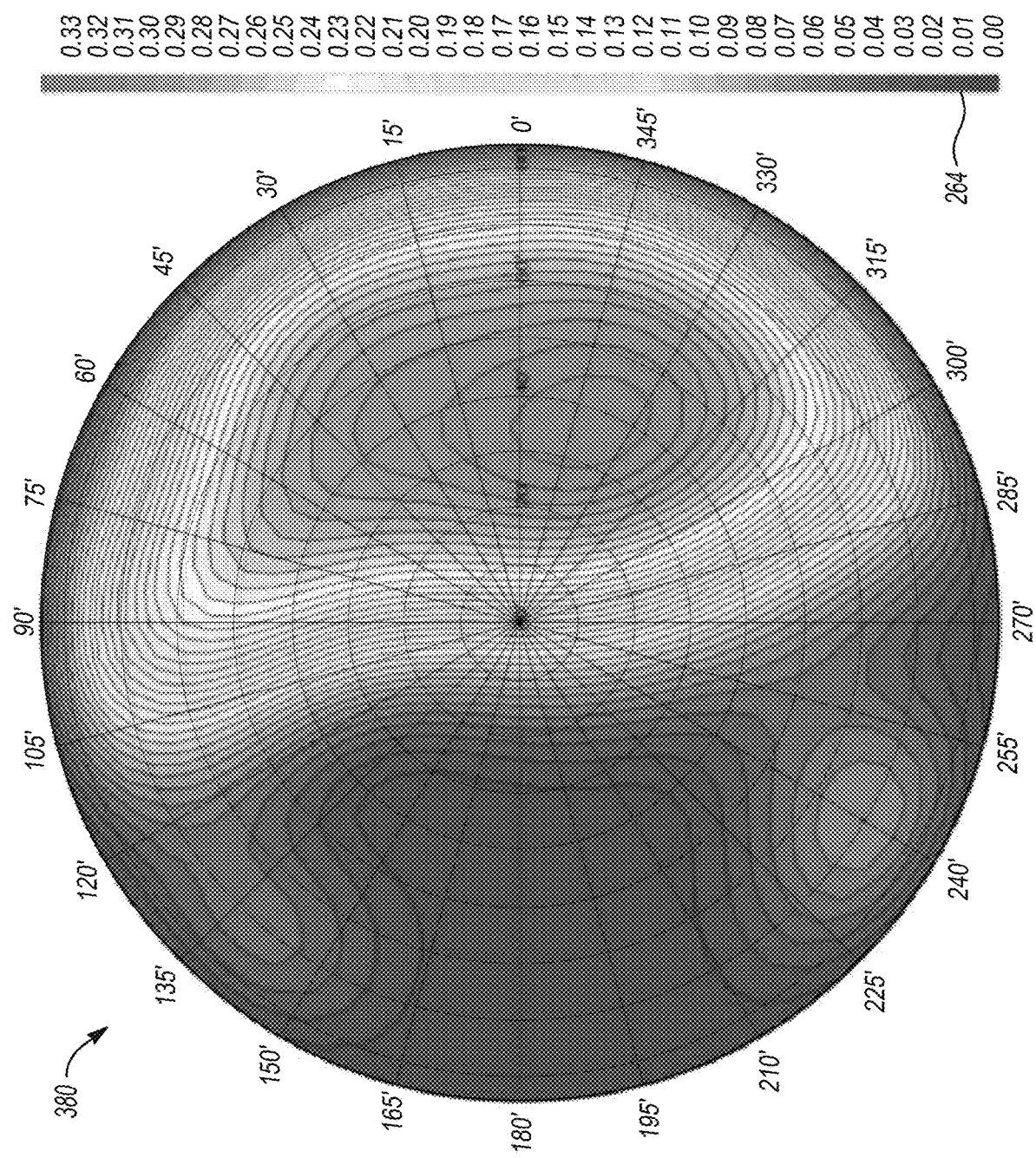
FIG. 19 illustrates a diagram of another spatial luminance profile in the private viewing mode in accordance with one or more exemplary embodiments.

FIG. 19 illustrates a diagram 380 of an example spatial luminance profile in the private viewing mode in accordance with one or more exemplary embodiments. The diagram 380 illustrates a luminance visibility shift at some viewing angles.

One or more of the display panels 100*a*-100*c* may implement a switchable privacy solution for thin-film transistor displays (with edge and matrix backlight) and organic light-emitting diode displays. Active privacy is achieved via means of liquid crystal retarder stack having at least one electrically switchable liquid crystal layer. In various embodiments, two switchable twisted nematic liquid crystal retarders with opposite liquid crystal twist angles are implemented. A combination of two switchable twisted nematic liquid crystal retarders provide good privacy performance. The opposing twist directions reduce the variation in color of the display panels within viewing angles of interest. In addition, compensation layers and half-wave plates may be used to optimize the power efficiency and privacy performance allowing to achieve lower power consumption than commercially available solutions.

In various embodiments, each twisted nematic cell may be configured in a normal white configuration meaning that the associated polarizer transmission axes are orthogonal relative to one another. Since the polarizer above and below the twisted nematic cell are arranged in an orthogonal configuration, the light passes through the upper polarizer and presents the light in the public mode. When power is applied for the private mode the liquid crystal molecules in the twisted nematic cell start aligning vertically. The greater the voltage, the more vertical the molecules become aligned. Because the molecules are not totally vertically aligned (due to anchoring forces), the birefringence from the liquid crystal changes as a function of angle. So for the privacy angle on one side of the display panel, the birefringence of the liquid crystal does not rotate the light and is therefore extinguished. However, on the other side of the display panel the birefringence still rotates the light. Therefore, an extent of the tilt of the liquid crystal molecules controls the amount of birefringence at each angle. For example, if a small voltage is applied to the twisted nematic cells, the peak may move to one side, but the extinguishing on the other side may not be as significant.

The present disclosure may have various modifications and alternative forms, and some representative embodiments are shown by way of example in the drawings and will be described in detail herein. Novel aspects of this disclosure are not limited to the particular forms illustrated in the above-enumerated drawings. Rather, the disclosure is to cover modifications, equivalents, and combinations falling within the scope of the disclosure.

Those having ordinary skill in the art will recognize that terms such as "above," "below," "front," "back," "upward," "downward," "top," "bottom," etc., may be used descriptively herein without representing limitations on the scope of the disclosure. Furthermore, the present teachings may be described in terms of functional and/or logical block components and/or various processing steps. Such block components may be comprised of various hardware components, software components executing on hardware, and/or firmware components executing on hardware.

The foregoing detailed description and the drawings are supportive and descriptive of the disclosure, but the scope of the disclosure is defined solely by the claims. As will be appreciated by those of ordinary skill in the art, various alternative designs and embodiments may exist for practicing the disclosure defined in the appended claims.

The invention claimed is:

1. A display panel comprising:
   a first polarizer configured to transfer a light to have a polarity of approximately 135 degrees;
   a first twisted nematic cell mounted adjacent to the first polarizer, wherein
   the first twisted nematic cell transfers the light received from the first polarizer in response to a first control signal,
   the first control signal is switchable between a first off state and a first on state,
   the first off state rotates the polarity of the light in a first twist from the approximately 135 degrees to approximately 225 degrees, and
   the first on state maintains the polarity of the light;
   a second twisted nematic cell mounted adjacent to the first twisted nematic cell, wherein
   the second twisted nematic cell transfers the light received from the first twisted nematic cell in response to a second control signal,
   the second control signal is switchable between a second off state and a second on state,
   the second off state rotates the polarity in a second twist from the approximately 225 degrees to the approximately 135 degrees,
   the second on state maintains the polarity of the light in the angular range, and
   the second twist is in an opposite direction as the first twist;
   a second polarizer mounted adjacent to the second twisted nematic cell and configured to polarize the light received from the second twisted nematic cell; and
   a display mounted adjacent to one of the first polarizer or the second polarizer and configured to generate an image in the light in response to a display signal, wherein
   while the first twisted nematic cell is in the first off state and the second twisted nematic cell is in the second off state, the image is viewable in a public viewing angle,
   while the first twisted nematic cell is in the first on state and the second twisted nematic cell is in the second on state, the image is viewable in a private viewing angle,
   the private viewing angle is narrower than the public viewing angle, and
   the private viewing angle is asymmetrical across an axis with luminance decreasing spatially at a higher rate to one side of center than the other side.

2. The display panel according to claim 1, wherein the display is a thin-film transistor display mounted adjacent to the second polarizer.

3. The display panel according to claim 2, further comprising a backlight source mounted adjacent to the first polarizer.

4. The display panel according to claim 3, further comprising a dual brightness enhancement film mounted between the backlight source and the first polarizer.

5. The display panel according to claim 1, wherein:
   the display is an organic light-emitting diode display mounted adjacent to the first polarizer; and
   the first polarizer is oriented in response to a polarization input for the first twisted nematic cell.

6. The display panel according to claim 5, further comprising a quarter-wave plate mounted adjacent to the display and oriented to one of 135 degrees or 45 degrees.

7. The display panel according to claim 1, further comprising a third polarizer mounted between the first twisted nematic cell and the second twisted nematic cell.

8. The display panel according to claim 1, further comprising a compensated half-wave plate mounted between the second twisted nematic cell and the second polarizer.

9. The display panel according to claim 1, further comprising a first compensation stack mounted between the first twisted nematic cell and the second twisted nematic cell.

10. The display panel according to claim 9, further comprising a second compensation stack mounted between the second twisted nematic cell and the second polarizer.

11. A display panel comprising:
    a first polarizer configured to transfer a light to have a polarity of approximately 135 degrees;
    a first twisted nematic cell mounted adjacent to the first polarizer, wherein
    the first twisted nematic cell has a first cell gap that results in a first color shift,
    the first twisted nematic cell transfers the light received from the first polarizer in response to a first control signal,
    the first control signal is switchable between a first off state and a first on state, and
    the first off state rotates the polarity of the light in a first twist from the approximately 135 degrees to approximately 225 degrees;
    a second twisted nematic cell mounted adjacent to the first twisted nematic cell, wherein
    the second twisted nematic cell has a second cell gap that results in a second color shift,
    the second color shift compensates for the first color shift,
    the second twisted nematic cell transfers the light received from the first twisted nematic cell in response to a second control signal,
    the second control signal is switchable between a second off state and a second on state, and
    the second off state rotates the polarity in a second twist from the approximately 225 degrees to the approximately 135 degrees;
    a second polarizer mounted adjacent to the second twisted nematic cell and configured to polarize the light received from the second twisted nematic cell; and
    a display mounted adjacent to one of the first polarizer or the second polarizer and configured to generate an image in the light in response to a display signal, wherein
    while the first twisted nematic cell is in the first off state and the second twisted nematic cell is in the second off state, the image is viewable in a public viewing angle,
    while the first twisted nematic cell is in the first on state and the second twisted nematic cell is in the second on state, the image is viewable in a private viewing angle,
    the private viewing angle is narrower than the public viewing angle, and
    the private viewing angle is asymmetrical across an axis with luminance decreasing spatially at a higher rate to one side of center than the other side.

12. The display panel according to claim 11, wherein the display is a thin-film transistor display mounted adjacent to the second polarizer.

13. The display panel according to claim 12, further comprising a backlight source mounted adjacent to the first polarizer.

14. The display panel according to claim 11, further comprising a third polarizer mounted between the first twisted nematic cell and the second twisted nematic cell.

15. The display panel according to claim 11, further comprising a compensated half-wave plate mounted between the second twisted nematic cell and the second polarizer.

16. A display panel comprising:
a first polarizer configured to transfer a light to have a polarity of approximately 135 degrees;
a first twisted nematic cell mounted adjacent to the first polarizer, wherein
the first twisted nematic cell transfers the light received from the first polarizer in response to a first control signal,
the first control signal is switchable between a first off state and a first on state,
the first off state rotates the polarity of the light in a first twist from the approximately 135 degrees to approximately 225 degrees, and
the first on state maintains the polarity of the light in an angular range;
a second twisted nematic cell mounted adjacent to the first twisted nematic cell, wherein
the second twisted nematic cell transfers the light received from the first twisted nematic cell in response to a second control signal, and
a second off state of the second control signal rotates the polarity in a second twist from the 225 degrees to the 135 degrees;
a second polarizer mounted adjacent to the second twisted nematic cell and configured to polarize the light received from the second twisted nematic cell; and
a display mounted adjacent to the second polarizer and configured to generate an image in the light in response to a display signal, wherein
while the first twisted nematic cell is in the first off state, the image is viewable in a public viewing angle,
while the first twisted nematic cell is in the first on state, the image is viewable in a private viewing angle,
the private viewing angle is narrower than the public viewing angle, and
the private viewing angle is asymmetrical across an axis with luminance decreasing spatially at a higher rate to one side of center than the other side.

17. The display panel according to claim 16, wherein the display is a thin-film transistor display.

18. The display panel according to claim 17, further comprising a backlight source mounted adjacent to the first polarizer.

19. The display panel according to claim 17, further comprising a compensation stack mounted between the first twisted nematic cell and the second polarizer.

20. A display panel comprising:
a first polarizer configured to transfer a light to have a polarity of approximately 135 degrees;
a first twisted nematic cell mounted adjacent to the first polarizer, wherein
the first twisted nematic cell transfers the light received from the first polarizer in response to a first control signal,
the first control signal is switchable between a first white state and a first black state,
the first white state rotates the polarity of the light in an angular range from the approximately 135 degrees to approximately 225 degrees, and
the first black state maintains the polarity of the light;
a second polarizer mounted adjacent to the first twisted nematic cell and configured to polarized the light received from the first twisted nematic cell to approximately 270 degrees;
a second twisted nematic cell mounted adjacent to the second polarizer-first twisted nematic cell, wherein
the second twisted nematic cell transfers the light received from the second polarizer in response to a second control signal,
the second control signal is switchable between an intermediate state and a second white state,
the second white state does not rotate the polarity,
the intermediate state rotates the polarity of the light from the approximately 270 degrees to approximately 0 degrees, and
the second twist is in a same direction as the first twist; and
a third polarizer mounted adjacent to the second twisted nematic cell and configured to polarize the light received from the second twisted nematic cell to approximately 45 degrees; and
a display mounted adjacent to one of the first polarizer or the second polarizer and configured to generate an image in the light in response to a display signal, wherein
the first twisted nematic cell and the second twisted nematic cell are controlled to present the image switchable between a public viewing angle and a private viewing angle,
the private viewing angle is narrower than the public viewing angle, and
the private viewing angle is asymmetrical across an axis with luminance decreasing spatially at a higher rate to one side of center than the other side.

* * * * *